(12) United States Patent
Matsumoto

(10) Patent No.: US 11,004,848 B2
(45) Date of Patent: *May 11, 2021

(54) COMPOSITE TRANSISTOR HAVING OVERLAPPING ACTIVE REGIONS AND CONTROL ELECTRODE

(71) Applicant: SONY CORPORATION, Tokyo (JP)

(72) Inventor: Koichi Matsumoto, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/866,079

(22) Filed: May 4, 2020

(65) Prior Publication Data

US 2020/0266193 A1    Aug. 20, 2020

Related U.S. Application Data

(63) Continuation of application No. 16/098,214, filed as application No. PCT/JP2017/012913 on Mar. 29, 2017, now Pat. No. 10,685,958.

(30) Foreign Application Priority Data

May 11, 2016   (JP) ................................. 2016-095194

(51) Int. Cl.
*H01L 27/092* (2006.01)
*H01L 27/06* (2006.01)
(Continued)

(52) U.S. Cl.
CPC ........ *H01L 27/092* (2013.01); *H01L 21/8221* (2013.01); *H01L 21/823871* (2013.01);
(Continued)

(58) Field of Classification Search
CPC ............... H01L 27/092; H01L 21/8221; H01L 29/78684
See application file for complete search history.

(56) References Cited

U.S. PATENT DOCUMENTS 10,685,958 B2 * 6/2020 Matsumoto ......... H01L 27/0688
2014/0332862 A1   11/2014 Guo et al.

FOREIGN PATENT DOCUMENTS

JP    2003-152191    5/2003

OTHER PUBLICATIONS

Official Action (with English translation) for Korea Patent Application No. 10-2018-7030457, dated Dec. 21, 2020, 9 pages.

* cited by examiner

*Primary Examiner* — Quoc D Hoang
(74) *Attorney, Agent, or Firm* — Sheridan Ross P.C.

(57) ABSTRACT

Disclosed herein is a composite transistor which includes a first transistor $TR_1$ including a control electrode, a first active region, a first A extending part, and a first B extending part, and a second transistor $TR_2$ including a control electrode, a second active region, a second A extending part, and a second B extending part. The first active region, the second active region, and the control electrode overlap one another. Both the first A extending part and the first B extending part extend from the first active region and both the second A extending part and the second B extending part extend from the second active region. The first electrode is connected to the first A extending part, the second electrode is connected to the second A extending part, and the third electrode is connected to the first B extending part and the second B extending part.

14 Claims, 25 Drawing Sheets

(51) Int. Cl.
*H01L 29/739* (2006.01)
*H01L 21/822* (2006.01)
*H01L 29/16* (2006.01)
*H01L 21/8238* (2006.01)
*H01L 27/11* (2006.01)
*H01L 29/423* (2006.01)
*H01L 29/66* (2006.01)
*H01L 29/786* (2006.01)

(52) U.S. Cl.
CPC ...... *H01L 27/0688* (2013.01); *H01L 27/1108* (2013.01); *H01L 29/16* (2013.01); *H01L 29/1606* (2013.01); *H01L 29/42384* (2013.01); *H01L 29/66045* (2013.01); *H01L 29/7391* (2013.01); *H01L 29/78684* (2013.01); *H01L 29/78696* (2013.01)

[FIRST LEVEL] [FIRST LEVEL]
[SECOND LEVEL] [SECOND LEVEL]

[THIRD LEVEL] [THIRD LEVEL]
[FOURTH LEVEL] [FOURTH LEVEL]

COMPOSITE TRANSISTOR HAVING OVERLAPPING ACTIVE REGIONS AND CONTROL ELECTRODE

CROSS REFERENCE TO RELATED APPLICATIONS

This application is a continuation of U.S. patent application Ser. No. 16/098,214, filed Nov. 1, 2018 which is a national stage application under 35 U.S.C. 371 and claims the benefit of PCT Application No. PCT/JP2017/012913 having an international filing date of 29 Mar. 2017, which designated the United States, which PCT application claimed the benefit of Japanese Patent Application No. 2016-095194 filed 11 May 2016, the entire disclosures of each of which are incorporated herein by reference.

TECHNICAL FIELD

The present disclosure relates to a composite transistor, more particularly, a complementary transistor.

BACKGROUND ART

CMOS circuits in the past including inverter circuits, NAND circuits, etc. include field effect transistors, each having a field effect transistor of p-channel type and a field effect transistor of n-channel type which are arranged side by side. Attempts have been made to scale down the layout of components, thereby increasing the gate density and reducing the power consumption. However, the scaling itself is becoming difficult as the technique of fabrication becomes more sophisticated and the manufacturing cost has been remarkably increasing.

One of the next-generation devices with low power consumption is the tunnel field effect transistor (TFET). The development of TFET has attracted attention to the two-dimensional material (2D material) such as Transition Metal DiChalcogenides (TMDC). An example of the TFET is disclosed in Japanese Patent Laid-open No. 2015-090984. The semiconductor element disclosed in the Japanese Published Unexamined Patent Application includes a semiconductor layer containing a two-dimensional substance and at least one non-semiconductor layer on at least one surface of the semiconductor layer, with the two-dimensional substance including a first two-dimensional substance containing a first metal chalcogenide substance and a second two-dimensional substance connecting to the side of the first two-dimensional substance and containing a second metal chalcogenide substance, the first two-dimensional substance and the second two-dimensional substance being chemically bonded together.

CITATION LIST

Patent Literature

[PTL 1]
Japanese Patent Laid-open No. 2015-090984

SUMMARY

Technical Problem

The TFET disclosed in Japanese Patent Laid-open No. 2015-090984, however, has a problem with difficulties in scaling as in the case of field effect transistors in the past.

Accordingly, the present disclosure is to provide a composite transistor which is so constructed as to achieve a higher density of integration.

Solution to Problem

The composite transistor of the present disclosure, which has been developed to achieve the foregoing object, includes a first transistor including a control electrode, a first active region, a first A extending part, and a first B extending part; and a second transistor including a control electrode, a second active region, a second A extending part, and a second B extending part, in which the first active region, the second active region, and the control electrode overlap with one another in an overlapping region, each of the transistors has a first electrode, a second electrode, and a third electrode, an insulation layer is provided between the control electrode and one of the first active region and the second active region both adjacent to the control electrode, each of the two transistors has the first A extending part that extends from one end of the first active region, the first B extending part that extends from other end of the first active region, the second A extending part that extends from one end of the second active region, and the second B extending part that extends from other end of the second active region, the first electrode connects to the first A extending part, the second electrode connects to the second A extending part, and the third electrode connects to the first B extending part and the second B extending part. Note that the order of overlapping of the first active region, the second active region, and the control electrode may be made in the order of the first active region, the second active region, and the control electrode or in the order of the second active region, the first active region, and the control electrode.

Advantageous Effects of Invention

The composite transistor according to the present disclosure includes a first transistor and a second transistor in which the control electrode, the first active region, and the second active region overlap with one another. This structure leads to a higher density of integration. Note that the effects mentioned herein are merely exemplary, and there will be additional effects.

DESCRIPTION OF EMBODIMENTS

Figure 1A:
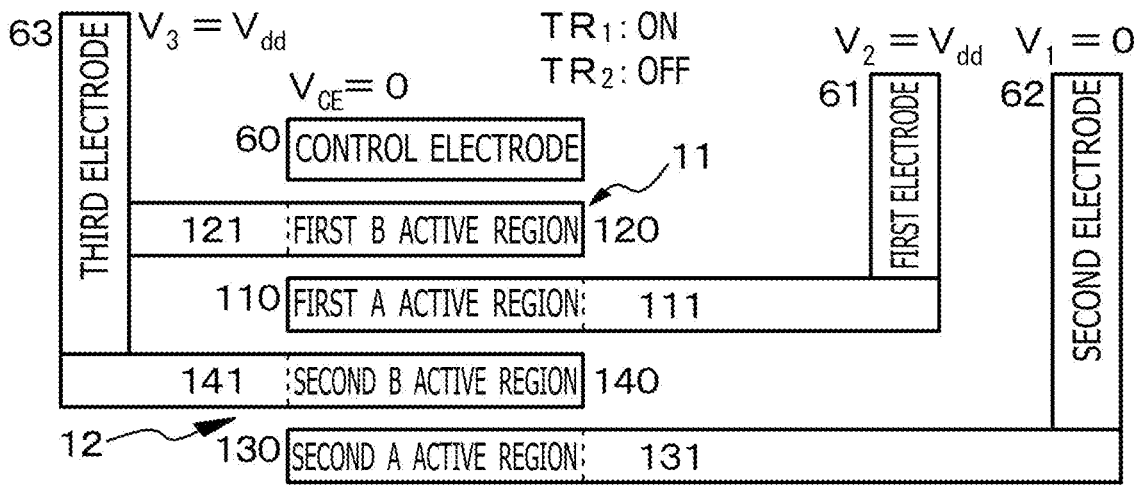
FIGS. 1A to 1C are conceptual diagrams depicting a composite transistor according to Example 1.

The present disclosure will be described in more detail with reference to the following examples, which are not intended to restrict the scope thereof. The various numerical values and materials depicted in Examples are merely exemplary. The following description will proceed in the order listed below.

1. General description of composite transistor according to present disclosure
2. Example 1 (Composite transistor of first structure according to present disclosure)
3. Example 2 (Modification to Example 1 of second structure according present disclosure)
4. Example 3 (Another modification to Example 1 of third structure according to present disclosure)
5. Example 4 (Applications of composite transistor according to present disclosure)
6. Others <General Description of Composite Transistor According to Present Disclosure>

A composite transistor of the present disclosure has a first electrode, a second electrode, and a control electrode.

The first electrode is given a higher voltage than that which is given to the second electrode.

When the control electrode is given a first voltage $V_1$, a first transistor becomes conductive and a second transistor becomes non-conductive, and when the control electrode is given a second voltage $V_2$ (which is higher than the first voltage $V_1$), the second transistor becomes conductive and the first transistor becomes non-conductive.

The composite transistor including preferred mode of the present disclosure additionally has a first active region and a second active region, which include a two-dimensional material or graphene.

The composite transistor including preferred mode of the present disclosure above is constructed as follows.

The composite transistor has an overlapping region in which the first active region includes a first A active region and a first B active region overlapping with the first A active region.

The composite transistor has a first A extending part which extends from the first A active region, and also has a first B extending part which extends from the first B active region.

In the overlapping region, the second active region includes a second A active region and a second B active region overlapping with the second A active region.

The composite transistor has a second A extending part which extends from the second A active region, and also has a second B extending part which extends from the second B active region.

The first A active region differs from the first B active region in energy values as defined below.

$E_{V-1A} < E_{V-1B}$ $E_{C-1A} < E_{C-1B}$ where $E_{V-1A}$ denotes the energy value at the upper end of the valence band of the first A active region;

$E_{C-1A}$ denotes the energy value at the lower end of the conduction band of the first A active region;

$E_{V-1B}$ denotes the energy value at the upper end of the valence band of the first B active region; and $E_{C-1B}$ denotes the energy value at the lower end of the conduction band of the first B active region.

The second A active region differs from the second B active region in energy values as defined below.

$E_{V-2A} > E_{V-2B}$ $E_{C-2A} > E_{C-2B}$ where $E_{V-2A}$ denotes the energy value at the upper end of the valence band of the second A active region;

$E_{C-2A}$ denotes the energy value at the lower end of the conduction band of the second A active region;

$E_{V-2B}$ denotes the energy value at the upper end of the valence band of the second B active region; and $E_{C-2B}$ denotes the energy value at the lower end of the conduction band of the second B active region. Incidentally, the composite transistor constructed as mentioned above will be referred to as "a composite transistor of a first structure according to the present disclosure" for the sake of convenience.

It satisfies the following conditions when the composite transistor is off:

$E_{C-1B} > E_{C-1A} > E_{V-1B} > E_{V-1A}$ and $E_{C-2A} > E_{C-2B} > E_{V-2A} > E_{V-2B}$ That is, it satisfies the following conditions when the composite transistor is on:

$E_{C-1B} > E_{V-1B} > E_{C-1A} > E_{V-1A}$, and $E_{C-2A} > E_{V-2A} > E_{C-2B} > E_{V-2B}$ The first A active region and the first B active region may overlap in any manner; for example, the first A active region may be adjacent to the control electrode or the first B active region may be adjacent to the control electrode. Likewise, the second A active region and the second B active region may overlap in any manner; for example, the second A active region may be adjacent to the control electrode or the second B active region may be adjacent to the control electrode.

Then, the composite transistor including the first structure of the present disclosure above may be constructed for stable operation such that a second insulation layer is interposed between the first active region and the second active region. Moreover, it may be constructed for stable operation such that a first interlayer insulation layer is interposed between the first A active region and the first B active region, and a second interlayer insulation layer is interposed between the second A active region and the second B active region. However, the second insulation layer, the first interlayer insulation layer, and the second interlayer insulation layer are not necessarily essential. There may be an instance in which the second insulation layer, the first interlayer insulation layer, and the second interlayer insulation layer are not necessary if the first A active region and the first B active region are made to change in energy band between them, and the second A active region and the second B active region are made to change in energy band between them based on the application of voltage to the control electrode which is mentioned later. These insulation layers may be a single layer of natural oxide or a laminate layer bonded together through van der Waals force.

Alternatively, the composite transistor including preferred mode of the present disclosure above is constructed as follows.

The composite transistor has an overlapping region in which a first active region includes a first A active region and a first B active region which is on the same virtual plane as the first A active region and is opposite to the first A active region.

The composite transistor has a first A extending part which extends from the first A active region, and also has a first B extending part which extends from the first B active region.

In the overlapping region, the second active region includes a second A active region and a second B active region which is on the same virtual plane as the second A active region and is opposite to the second A active region.

The composite transistor has a second A extending part which extends from the second A active region, and also has a second B extending part which extends from the second B active region.

The first A active region differs from the first B active region in energy values as defined below.

$E_{V-1A} < E_{V-1B}$ $E_{C-1A} < E_{C-1B}$ where $E_{V-1A}$ denotes the energy value at the upper end of the valence band of the first A active region;

$E_{C-1A}$ denotes the energy value at the lower end of the conduction band of the first A active region;

$E_{V-1B}$ denotes the energy value at the upper end of the valence band of the first B active region; and $E_{C-1B}$ denotes the energy value at the lower end of the conduction band of the first B active region.

The second A active region differs from the second B active region in energy values as defined below.

$E_{V-2A} > E_{V-2B}$ $E_{C-2A} > E_{C-2B}$ where $E_{V-2A}$ denotes the energy value at the upper end of the valence band of the second A active region;

$E_{C-2A}$ denotes the energy value at the lower end of the conduction band of the second A active region;

$E_{V-2B}$ denotes the energy value at the upper end of the valence band of the second B active region; and $E_{C-2B}$ denotes the energy value at the lower end of the conduction band of the second B active region. Incidentally, the composite transistor constructed as mentioned above will be referred to as "a composite transistor of a second structure of the present disclosure" for the sake of convenience.

That is, it satisfies the following conditions when the composite is off:

$E_{C-1B} > E_{C-1A} > E_{V-1B} > E_{V-1A}$, and $E_{C-2A} > E_{C-2B} > E_{V-2A} > E_{V-2B}$ It satisfies the following conditions when the composite is on:

$E_{C-1B} > E_{V-1B} > E_{C-1A} > E_{V-1A}$, and $E_{C-2A} > E_{V-2A} > E_{C-2B} > E_{V-2B}$ The composite transistor of the second structure of the present disclosure above may be constructed for stable operation such that a second insulation layer is interposed between the first active region and the second active region. It is to be noted that the second insulation layer is not always essential. There may be an instance in which the second insulation layer is not necessary if the first A active region and the first B active region are made to change in energy band between them, and the second A active region and the second B active region are made to change in energy band between them based on the application of voltage to the control electrode which is mentioned later. The second insulation layer may be a single layer of natural oxide or a laminate layer bonded together through van der Waals force.

The composite transistor of the present disclosure may also be constructed as follows.

The composite transistor has an overlapping region in which a first active region includes a first channel forming region, a first A extending region extends from one end of the first channel forming region, and a first B extending region extends from the other end of the first channel forming region, and the composite transistor also has an overlapping region in which a second active region includes a second channel forming region, a second A extending region extends from one end of the second channel forming region, and a second B extending region extends from the other end of the second channel forming region.

When the control electrode is given a second voltage $V_2$ (which is higher than the first voltage $V_1$) the second transistor becomes conductive and the first transistor becomes non-conductive. Incidentally, the composite transistor constructed as mentioned above will be referred to as "a composite transistor of a third structure of the present disclosure" for the sake of convenience.

The composite transistor including the third structure of the present disclosure above may additionally have a second insulation layer between the first active region and the second active region. In the composite transistor including the third structure of the present disclosure including such a structure, the first active region and the second active region may preferably include a two-dimensional material or graphene.

The composite transistor including preferred various modes and configurations of the present disclosure described above will be generally and simply referred to as "Composite transistor disclosed herein" hereinafter. It may be constructed such that the first electrode is given a higher voltage than that which is given to the second electrode. Specifically, the first electrode is given the second voltage $V_2$ (or $V_{dd}$ volt>0) and the second electrode is given the first voltage $V_1$ (or 0 volt). Incidentally, the first voltage $V_1$ and the second voltage $V_2$ applied to the control electrode are based on the first A active region and the second A active region as the reference.

Figure 25A:
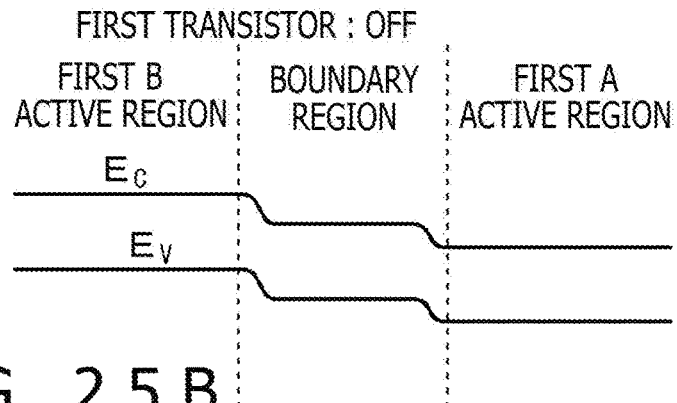
FIGS. 25A to 25D are schematic diagrams depicting change in an energy band in each active region that occurs when conduction is turned on or off in a composite transistor including a first structure or a second structure of the present disclosure.
Figure 25B:
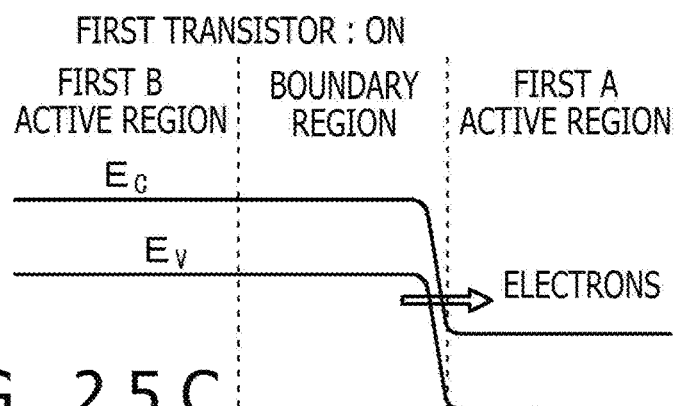
Figure 25C:
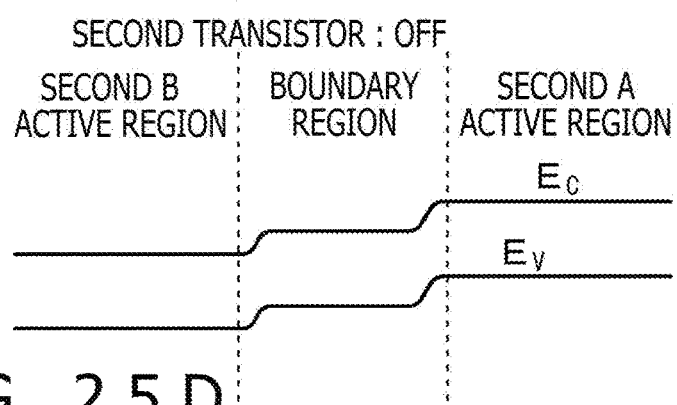

The composite transistor including the first structure and the second structure according to the present disclosure function in the following manner. When the control electrode is given the first voltage $V_1$ (which is lower than the second voltage $V_2$), the first A active region as a constituent of the first transistor is given the second voltage $V_2$, for example. This makes the first transistor to change in energy values as follows. Assume that a first boundary region between the first A active region and the first B active region has the valence band whose energy value is $E_{V\text{-}1\text{-}IF}$ at its upper end and also has the conduction band whose energy value is $E_{C\text{-}1\text{-}IF}$ at its lower end. Assume also that the first B active region has the valence band whose energy value is $E_{V\text{-}1B}$ at its upper end and also has the conduction band whose energy value is $E_{C\text{-}1B}$ at its lower end. Then, it follows that former two values approach the latter two values, respectively. (See FIG. 25B.) The consequence is the movement of electrons, due to tunnel effect, from the first B active region to the first A active region. This in turn makes the first transistor conductive and causes the first A active region and the first B active region to have ideally the same potential, which makes the third electrode have the same potential as the second potential $V_2$. On the other hand, the second transistor has the second A active region given the first voltage $V_1$ and also has the control electrode given the first voltage $V_1$. The result is that the second transistor remains unchanged in the energy value $E_{V\text{-}2\text{-}IF}$ of the valence band at its upper end and the energy value $E_{C\text{-}2\text{-}IF}$ of the conduction band at its lower end in a second boundary region between the second A active region and the second B active region. (See FIG. 25C.) The consequence is the absence of electron movement from the second A active region to the second B active region, which keeps the second transistor non-conductive.

Figure 25D:
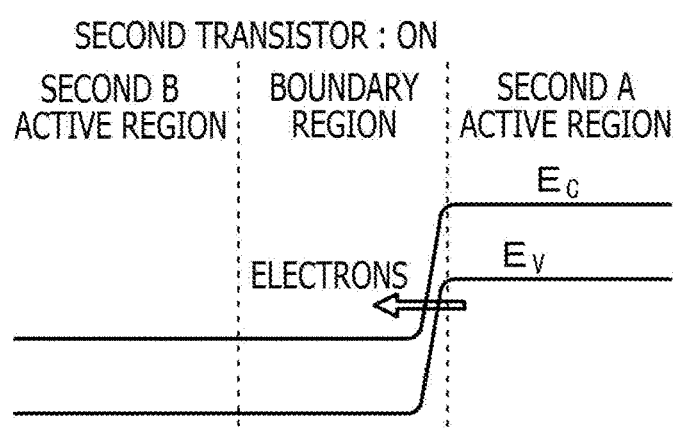

Also, the composite transistor including the first structure and the second structure according to the present disclosure function in the following manner. When the control electrode is given the second voltage $V_2$ (which is higher than the first voltage $V_1$), the second A active region as a constituent of the second transistor is given the first voltage $V_1$. This makes the second transistor to change in energy values as follows. Assume that the second boundary region between the second A active region and the second B active region has the valence band whose energy value is $E_{V\text{-}2\text{-}IF}$ at its upper end and also has the conduction band whose energy value is $E_{C\text{-}2\text{-}IF}$ at its lower end. Assume also that the second B active region has the valence band whose energy value is $E_{V\text{-}2B}$ at its upper end and also has the conduction band whose energy value is $E_{C\text{-}2B}$ at its lower end. Then, it follows that former two values approach the latter two values, respectively. (See FIG. 25D.) The consequence is the movement of electrons (due to tunnel effect) from the second A active region to the second B active region. This in turn makes the second transistor conductive and causes the second A active region and the second B active region to have ideally the same potential, which makes the third electrode have the first potential $V_1$. On the other hand, the first transistor has the first A active region given the second voltage $V_2$ and also has the control electrode given the second voltage $V_2$. The result is that the first transistor remains unchanged in the energy value $E_{V\text{-}1\text{-}IF}$ of the valence band at its upper end and the energy value $E_{C\text{-}1\text{-}IF}$ of the conduction band at its lower end in the first boundary region between the first A active region and the first B active region. (See FIG. 25A.) The consequence is the absence of electron movement from the first A active region to the first B active region, which keeps the first transistor non-conductive.

The composite transistor including the first structure and the second structure according to the present disclosure is regarded as including a first transistor corresponding to an FET of p-channel type and a second transistor corresponding to an FET of n-channel type. In addition, it has the first A active region and the second A active region each corresponding to the source in FET. It has the first B active region and the second B region each corresponding to the drain in FET. It has the control electrode corresponding to the gate in FET. The composite transistor including the first structure and the second structure according to the present disclosure may have the first A active region and the second B active region referred to as "n-type active region" and also have the first B active region and the second A active region referred to as "p-type active region" for the sake of convenience.

The composite transistor including the third structure of the present disclosure basically functions in the same way as the field effect transistor in the past.

The composite transistor of the present disclosure has the overlapping region in which the first active region and the control electrode overlap each other. In this case, the first active region may have its orthogonal projection image which is surrounded by that of the control electrode, or which coincides with that of the control electrode, or which projects from that of the control electrode. Likewise, it has the overlapping region in which the second active region and the control electrode overlap each other. In this case, the second active region may have its orthogonal projection image which is surrounded by that of the control electrode, or which coincides with that of the control electrode, or which projects from that of the control electrode.

In addition, the composite transistor including the first structure of the present disclosure has the overlapping region in which the first A active region and the first B active region constituting the first active region overlap each other. In this case, the region where the first A active region and the first B active region overlap each other may have its orthogonal projection image which is surrounded by that of the control electrode, or which coincides with that of the control electrode, or which projects from that of the control electrode. Likewise, it has the overlapping region in which the second A active region and the second B active region constituting the second active region overlap each other. In this case, the region where the second A active region and the second B active region overlap each other has its orthogonal projection image which is surrounded by that of the control electrode, or which coincides with that of the control electrode, or which projects from that of the control electrode.

The composite transistor of the present disclosure should preferably be constructed such that the first A extending part and the first B extending part extend in the same direction as the second A extending part and the second B extending part extend.

The composite transistor including the first structure and the second structure of the present disclosure may have four, three, or two active regions which include different materials as follows.

[A] Four different kinds of materials for the first A active region including the first A extending part, the first B active region including the first B extending part, the second A active region including the second A extending part, and the second B active region including the second B extending part.

[B] One kind of material for the first A active region and the second B active region, and two kinds of materials for the first B active region and the second A active region.

[C] Two kinds of materials for the first A active region and the second B active region and one kind of material for the first B active region and the second A active region.

[D] One kind of material for the first A active region and the second B active region and one kind of material for the first B active region and the second A active region.

In the case where the first A active region and the second B active region include different materials, it is possible to form the first A active region and the second B active region from the same material which is doped with different dopants. Likewise, in the case where the first B active region and the second A active region include different materials, it is possible to form the first B active region and the second A active region from the same material which is doped with different dopants. Doping may be accomplished by ion injection or chemical doping.

Examples of the dopant for the p-type active region include the following.

Ionic solutions such as $NO_2BF_4$, $NOBF_4$, and $NO_2SbF_6$.

Acids such as HCl, $H_3PO_4$, $CH_3COOH$, $H_2SO_4$, and $HNO_3$.

Organic composites such as dichlorodicyanoquinone, oxone, dimyristoylphosphathidylinositol, and trifluoromethanesulfoneimide.

$HPtCl_4$, $AuCl_3$, $HAuCl_4$, silver trifluoromethanesulfonate, $AgNO_3$, $H_2PdCl_6$, $Pd(OAc)_2$, and $Cu(CN)_2$.

In addition, examples of the dopant for the n-type active region include the following.

NMNH (nicotinamide mononucleotide-H), NADH (nicotinamide adenine dinucleotide-H), NADPH (nicotinamide adenine dinucleotide phosphate-H), PEI (polyethyleneimine), and alkali metals (such as potassium and lithium).

The composite transistor of the present disclosure may have the first active region and the second active region which include a two-dimensional material, as mentioned above. Its typical example includes TMDC (Transition Metal DiChalcogenide). TMDC is represented by $MX_2$, where M denotes a transition metal such as Ti, Zr, Hf, V, Nb, Ta, Mo, W, Tc, and Re, and X denotes a chalcogen such as O, S, Se, and Te. The TMDC also includes CuS, which is a composite including Cu (transition metal) and S (chalcogen), or includes a composite including a nontransition metal and a chalcogen, the former including Ga, In, Ge, Sn, and Pb. Such composite may be exemplified by GaS, GaSe, GaTe, $In_2Se_3$, $InSnS_2$, $SnSe_2$, GeSe, $SnS_2$, and PbO. Moreover, the composite transistor of the present disclosure may have the first and second active regions including a two-dimensional material such as black phosphorus.

The two-dimensional material exemplified below may be used for the first A active region or the second B active region (n-type active region) in the composite transistor including the first and second structures of the present disclosure. The two-dimensional material exemplified below may also be used for the second A extending part and the second B extending part in the composite transistor including the third structure of the present disclosure. At least one kind of two-dimensional material selected from the group including $MoSe_2$, $MoTe_2$, $WSe_2$, $MoS_2$, and $WTe_2$, which have a thickness of 0.65 to 6.5 nm, preferably 0.65 to 2.6 nm. On the other hand, the two-dimensional material exemplified below may be used for the first B active region or the second A active region (p-type active region) in the composite transistor including the first and second structures of the present disclosure. The two-dimensional material exemplified below may also be used for the first A extending part and the first B extending part in the composite transistor including the third structure of the present disclosure. At least one kind of two-dimensional material selected from the group including $MoS_2$, $WS_2$, $ZrS_2$, $ZrSe_2$, $HfS_2$, $HfSe_2$, $NbSe_2$, and $ReSe_2$, which have a thickness of 0.65 to 6.5 nm, preferably 0.65 to 2.6 nm. The foregoing examples are not intended to restrict the scope of the disclosure.

In the case where the first A active region and the second B active region include different kinds of two-dimensional material, the two-dimensional material for the first A active region is represented by $M^{1A}X^{1A}_2$ and the two-dimensional material for the first B active region is represented by $M^{1B}X^{1B}_2$, where:
$M^{1A} \neq M^{1B}$ and $X^{1A} \neq X^{1B}$, or
$M^{1A} = M^{1B}$ and $X^{1A} \neq X^{1B}$, or
$M^{1A} \neq M^{1B}$ and $X^{1A} = X^{1B}$.

Likewise, the two-dimensional material for the second A active region is represented by $M^{2A}X^{2A}_2$ and the two-dimensional material for the second B active region is represented by $M^{2B}X^{2B}_2$, where:
$M^{2A} \neq M^{2B}$ and $X^{2A} \neq X^{2B}$, or
$M^{2A} = M^{2B}$ and $X^{2A} \neq X^{2B}$, or
$M^{2A} \neq M^{2B}$ and $X^{2A} = X^{2B}$.

The foregoing examples are not intended to restrict the scope of the disclosure.

There are several methods for forming the first A active region, the first B active region, the second A active region, and the second B active region. They include PVD method and CVD method as well as those mentioned below.

[a] One including steps of preparing a precursor of transition metal chalcogenite, applying the precursor onto the substrate to form a thin film thereon, and performing heart treatment.
[b] One including steps of coating the substrate with a thin film of a transition metal oxide and causing the transition metal in the transition metal oxide to react with a chalcogen in a material containing a chalcogen element.

The term "graphene" mentioned above denotes a sheet-like substance of carbon atoms with $sp^2$ bond, having a thickness equal to one atom. It has a hexagonal lattice structure, like honeycomb, including carbon atoms binding together. The graphene film can be doped with an n-type or p-type impurity by chemical doping. The chemical doping is accomplished by coating the graphene film with a dopant layer. The dopant layer may be that of electron accepting type (or p-type) or that of electron donating type (or n-type). The dopant layer of electron accepting type (or p-type) may include chlorides (such as $AuCl_3$, $HAuCl_4$, and $PtCl_4$), acids (such as $HNO_3$, $H_2SO_4$, HCl, and nitromethane), Group III elements (such as boron and aluminum), and oxygen, which are electron attracting molecules. The dopant layer of electron donating type (or n-type) may include Group V elements (such as nitrogen and phosphorus), pyridine composites, nitrides, alkali metals, and aromatic composites having alkyl groups, which are electron-donating molecules.

Graphene may be produced by the following method. First, a base is coated with a film containing a graphenizing catalyst. Then, the film containing a graphenizing catalyst is provided with a gas-phase carbon source. This step is followed by heat treatment to grow graphene. Finally, the resulting graphene is cooled at a prescribed rate. In this way, it is possible to coat the film containing a graphenizing catalyst with film-like graphene. The graphenizing catalyst includes, for example, carbon composites (such as SiC) and at least one kind of metal selected from the group including Ni, Co, Fe, Pt, Au, Al, Cr, Cu, Mg, Mn, Mo, Rh, Si, Ta, Ti, W, U, V, and Zr. The gas-phase carbon source includes, for example, at least one species of carbon source selected from the group including carbon monoxide, methane, ethane, ethylene, ethanol, acetylene, propane, butane, butadiene, pentane, pentene, cyclopentadiene, hexane, cyclohexane, benzene, and toluene. The thus formed film-like graphene is separated from the film containing a graphenizing catalyst. In this way there is obtained graphene as desired.

The composite transistor including the first structure of the present disclosure has two active regions as mentioned above. The first A active region and the first B active region overlap with each other, and they may be in contact with each other or they may be separated from each other, with the first boundary region interposed between them. Likewise, the second A active region and the second B active region overlap with each other, and they may be in contact with each other or they may be separated from each other, with the second boundary region interposed between them. The first and second boundary regions may include the first interlayer insulation layer and the second interlayer insulation layer as mentioned above.

The composite transistor including the second structure of the present disclosure has two active regions as mentioned above. The first A active region and the first B active region face each other, and they may be in contact with each other or they may be separated from each other, with a first boundary region interposed between them. Likewise, the second A active region and the second B active region face each other, and they may be in contact with each other or they may be separated from each other, with the second boundary region interposed between them. The first and second boundary regions may include such materials as $SiO_2$ (including natural oxide film), SiN, hexagonal boron nitride (hBN), and $Al_2O_3$.

The composite transistor of the present disclosure has the control electrode which includes any one of such materials as polysilicon, polycide, metallic silicide, metal nitride (e.g., TiN), metals (e.g., aluminum (Al) and gold (Au)), graphene, and ITO. The control electrode may be formed by any one of such methods as physical vapor deposition (PVD method), including vacuum vapor deposition and sputtering, and chemical vapor deposition (CVD method). The first to third electrodes may include any one of such conductive materials as impurity-doped polysilicon, aluminum, and high-melting point metals and metal silicides including tungsten, Ti, Pt, Pd, Cu, TiW, TiNW, $WSi_2$, and $MoSi_2$. The control electrode may be formed by PVD method or CVD method.

Moreover, the insulation layer and the second insulation layer include such materials as $SiO_2$, SiOF, SiN, and SiON, as well as those materials with a high dielectric constant k ($\varepsilon/\varepsilon_0 \geq 4.0$). Examples of the high dielectric materials include metal oxides and metal nitrides, such as hafnium oxide ($HfO_2$), zirconium oxide ($ZrO_2$), aluminum oxide ($Al_2O_3$), aluminum-hafnium oxide ($HfAlO_2$), silicon-hafnium oxide (HfSiO), tantalum oxide ($Ta_2O_5$), yttrium oxide ($Y_2O_3$), and lanthanum oxide ($La_2O$). They also include insulation materials of metal silicate such as HfSiO, HfSiON, ZrSiO, AlSiO, and LaSiO. The insulation layer and the second insulation layer may include one kind of material or more than one kind of materials. Also, the insulation layer and the second insulation layer may be of monolayer structure or multiplelayer structure. The insulation layer and the second insulation layer may be formed by any one of the CVD methods including ALD (Atomic Layer Deposition) and MOCVD (organometal vapor phase deposition), or the PVD methods including vacuum vapor deposition and sputtering. The insulation layer may have a thickness ranging from 1 to 10 nm, and the second insulation layer may have a thickness ranging from 1 to 10 nm.

The first interlayer insulation layer and the second interlayer insulation layer may include $SiO_2$, SiN, hexagonal boron nitride (hBN), and $Al_2O_3$. The first interlayer insulation layer and the second interlayer insulation layer may be formed by low-temperature oxidation method, plasma CVD method, and ALD method. The first interlayer insulation layer and the second interlayer insulation layer may have a thickness ranging from 1 to 3 nm.

The composite transistor of the present disclosure may be formed on a silicon semiconductor substrate coated with an insulation film.

The composite transistor of the present disclosure may be used to construct complementary transistors and logical circuits (such as inverter circuits, NAND circuits, AND circuits, NOR circuits, OR circuits, XOR circuits, and NOT circuits) and also memories such as SRAM.

Example 1

Example 1 demonstrates the composite transistor according to the present disclosure. To be more specific, the composite transistor is that of the first structure of the present disclosure. The composite transistor of Example 1 may constitute a complementary transistor and an inverter circuit.

Figure 1B:
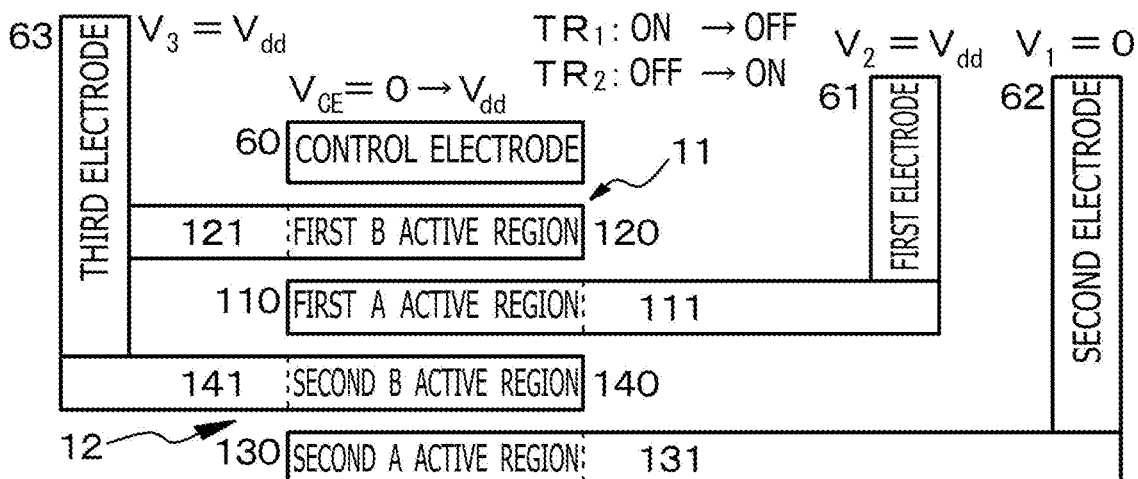
Figure 1C:
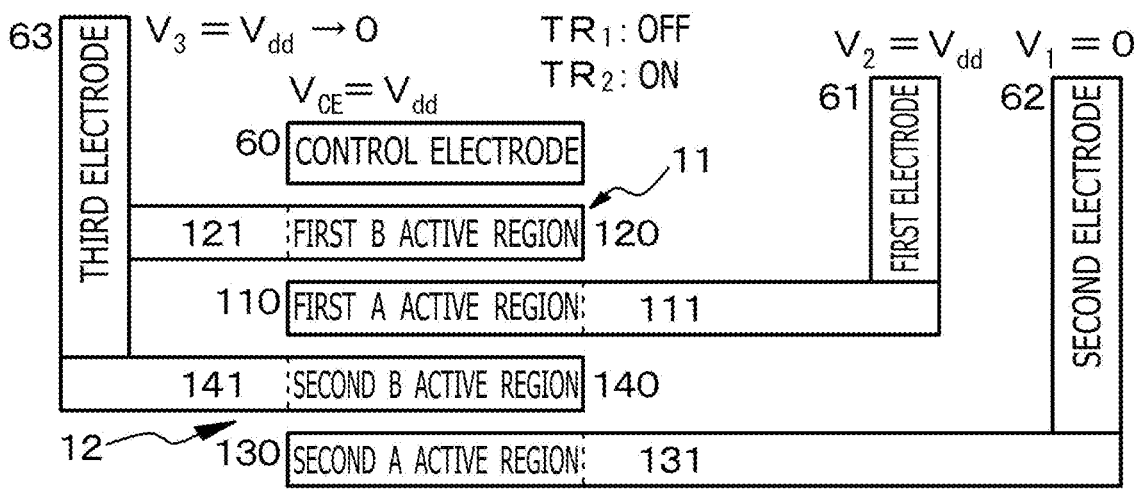
Figure 2A:
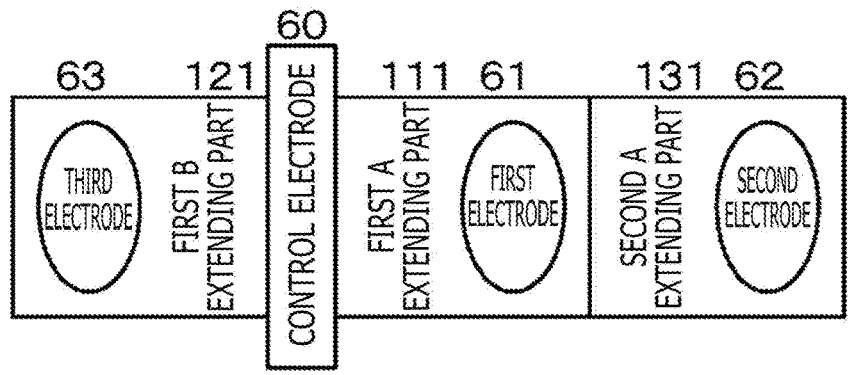
FIGS. 2A and 2B are schematic diagrams depicting an arrangement of constituents of an inverter circuit including the composite transistor according to Example 1.
Figure 2B:
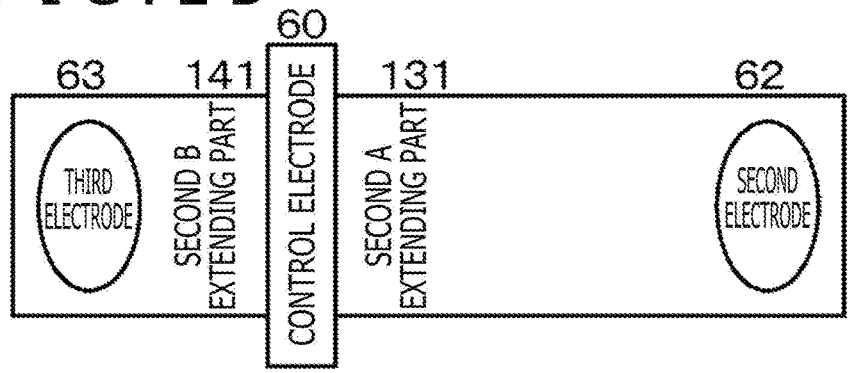
Figure 2C:
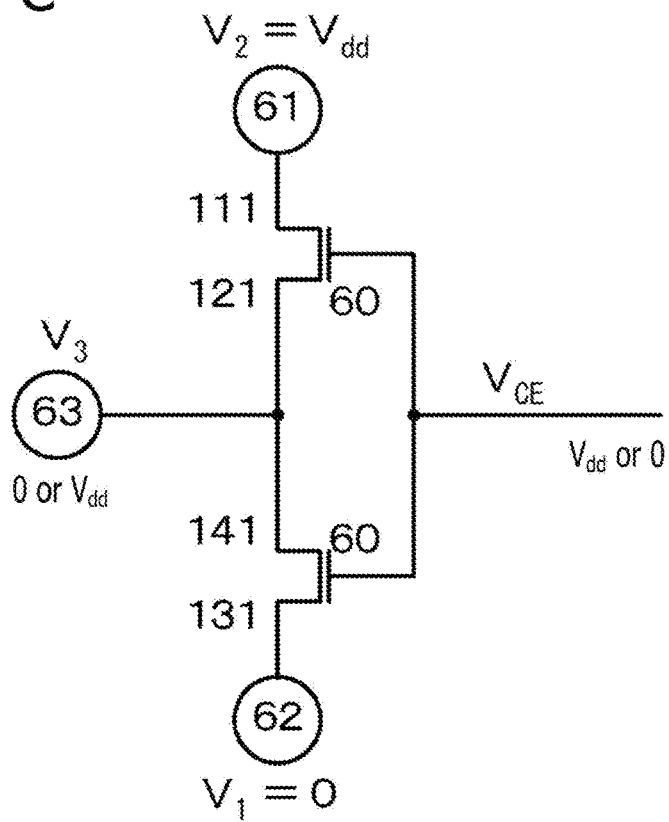
FIG. 2C is an equivalent circuit of the inverter circuit which includes the composite transistor according to Example 1.
Figure 3:
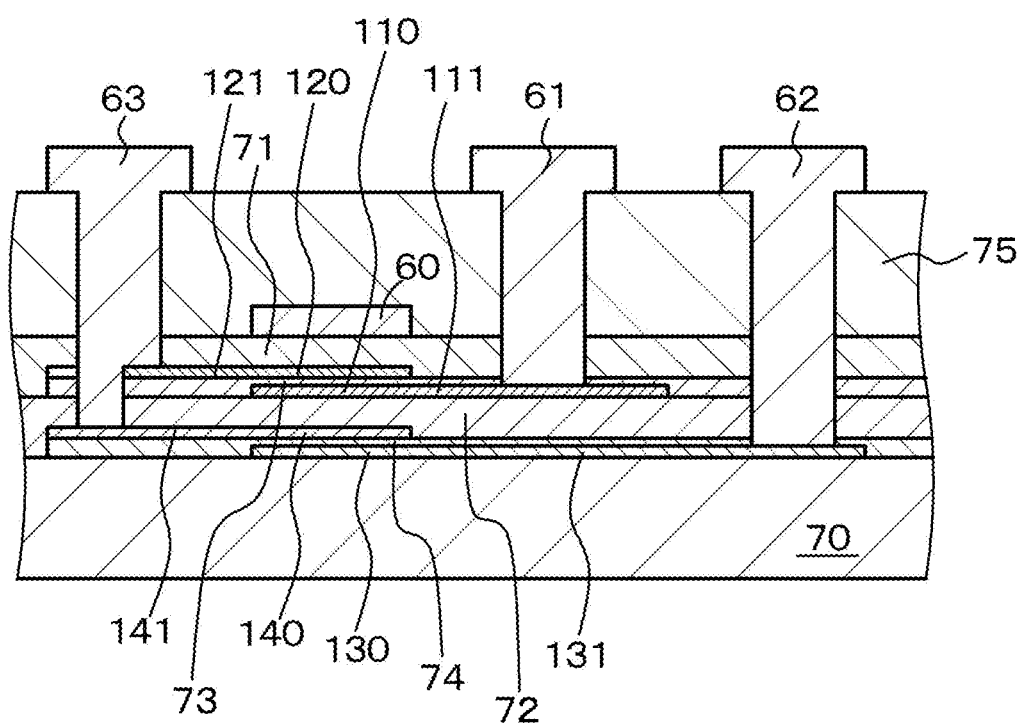
FIG. 3 is a schematic partly cutaway sectional view of the composite transistor according to Example 1.
Figure 4A:
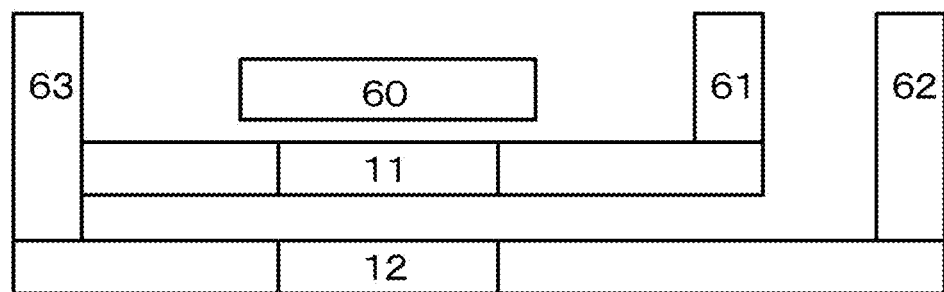
FIGS. 4A to 4C are conceptual diagrams depicting a positional relation among a first active region, a second active region, and a control electrode in the composite transistor according to Example 1.
Figure 4B:
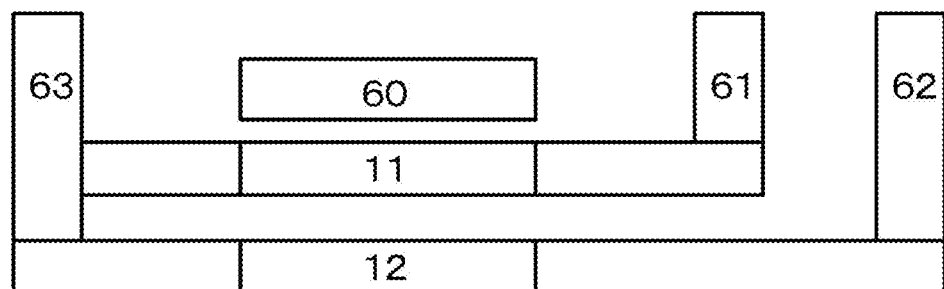
Figure 4C:
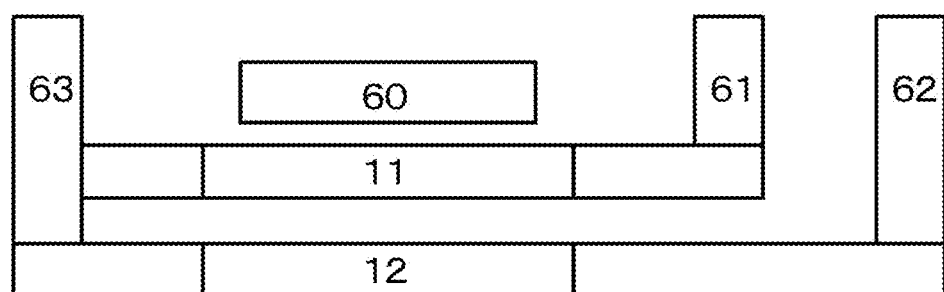
Figure 5A:
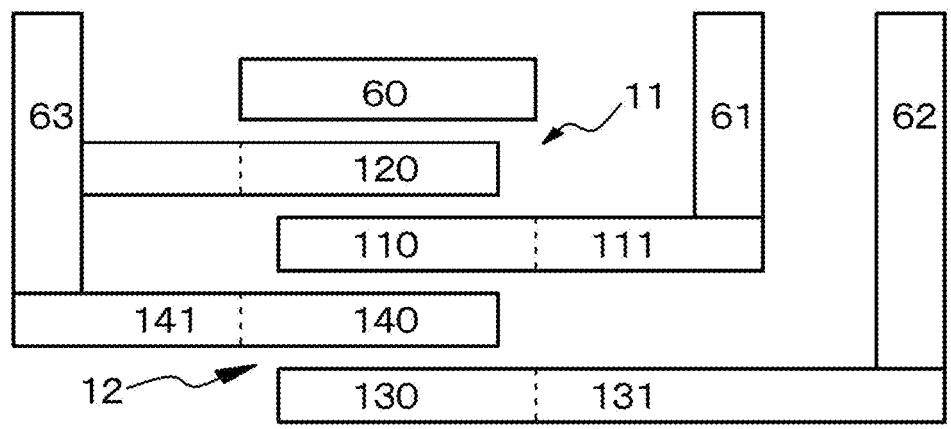
FIGS. 5A to 5C are conceptual partly cutaway sectional views depicting the composite transistor according to Example 1.
Figure 5B:
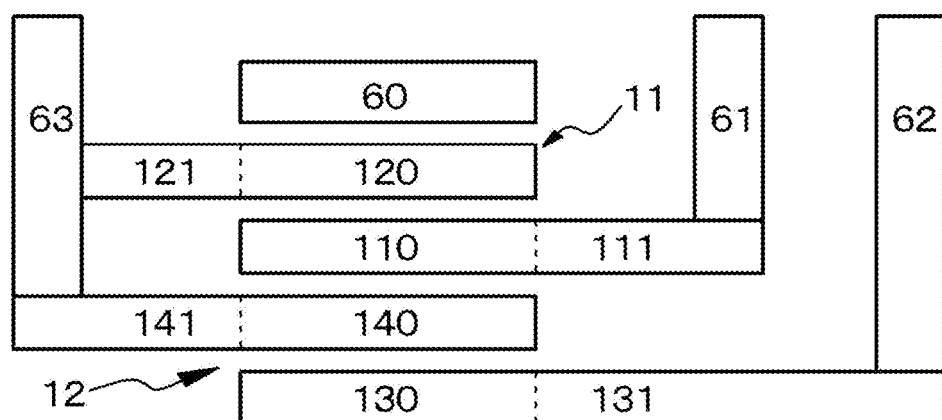
Figure 5C:
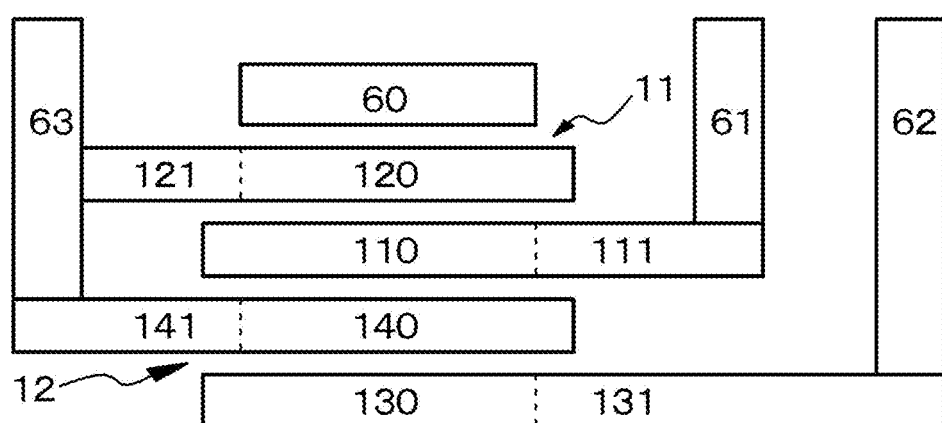

FIGS. 1A to 1C are conceptual diagrams depicting the composite transistor of Example 1, FIGS. 2A and 2B are schematic diagrams depicting the arrangement of the constituents of the inverter circuit constituted of the composite transistor of Example 1, and FIG. 2C is a schematic diagram depicting the equivalent circuit of the inverter circuit, which is configured by the composite transistor of Example 1, with employing the symbols for FET for convenience sake. FIG. 3 is a schematic partly cutaway sectional view depicting the composite transistor of Example 1. FIGS. 4A to 4C are conceptual diagrams depicting the positional relation among the first active region, the second active region, and the control electrode in the composite transistor of Example 1. FIGS. 5A to 5C are conceptual partly cutaway diagrams each depicting the composite transistor of Example 1. Incidentally, FIG. 1A depicts that the first transistor is conductive (on) and the second transistor is non-conductive (off). FIG. 1B depicts that the state of the first transistor transitions from conductive (on) to non-conductive (off) and that the state of the second transistor transitions from non-conductive (off) to conductive (on). FIG. 1C depicts that the first transistor is non-conductive (off) and the second transistor is conductive (on). In practice, FIGS. 2A and 2B overlap with each other.

The composite transistors of Example 1 and Examples 2 and 3 (to be mentioned later) are constructed as follows. A first active region 11, 11', 11", a second active region 12, 12', 12", and a control electrode 60 overlap with one another. The composite transistor includes a first electrode 61, a first electrode 61, and a third electrode 63. An insulation layer 71 is interposed between the control electrode 60 and the first active region 11, 11', 11" or the second active region 12, 12', 12" adjacent thereto. (The first active region 11, 11', 11" is depicted.) The control electrode 60 includes TiN; the first electrode 61, a second electrode 62, and the third electrode 63 include platinum (Pt); and the insulation layer 71 includes hafnium oxide (HfO$_2$), 1 nm thick.

Then, the composite transistor is additionally constructed as follows. First A extending part 111, 211, 311 extends from one end of the first active region 11, 11', 11"; First B extending part 121, 221, 321 extends from the other end of the first active region 11, 11', 11"; Second A extending part 131, 231, 331 extends from one end of the second active region 12, 12', 12"; and Second B extending part 141, 241, 341 extends from the other end of the second active region 12, 12', 12". The first electrode 61 is connected to the first A extending part 111, 211, 311; the second electrode 62 is connected to the second A extending part 131, 231, 331; the third electrode 63 is connected to the first B extending part 121, 221, 321 and the second B extending part 141, 241, 341. A first transistor TR$_1$ includes the control electrode 60, the first active region 11, 11', 11", the first A extending part 111, 211, 311, and the first B extending part 121, 221, 321; and a second transistor TR$_2$ includes the control electrode 60, the second active region 12, 12', 12", the second A extending part 131, 221, 331, and the second B extending part 141, 241, 341.

The composite transistors of Example 1 and Examples 2 and 3 (to be mentioned later) function in the following manner. When the first electrode 61 is given a higher voltage than that which is applied to a second electrode 62 and the control electrode 60 is given a first voltage V$_1$ (=0 volt), the first transistor TR$_1$ becomes conductive and the second transistor TR$_2$ becomes non-conductive. When the control electrode 60 is given a second voltage V$_2$ (=V$_{dd}$>0 volt) higher than a first voltage V$_1$ (=0 volt), the second transistor TR$_2$ becomes conductive and the first transistor TR$_1$ becomes non-conductive. Incidentally, the voltage applied to the first electrode 61 is designated as V$_2$ (=V$_{dd}$), and the voltage applied to the second electrode 62 is designated as V$_1$ (=0<V$_2$=V$_{dd}$). In FIGS. 1A to 1C, FIGS. 7A to 7C, and FIGS. 9A to 9C, the voltage applied to the control electrode 60 is designated as V$_{CE}$ and the voltage applied to a third electrode 63 is designated as V$_3$.

The composite transistors of Example 1 and Examples 2 and 3 (to be mentioned later) have the first active region 11, 11', 11" and the second active region 12, 12', 12" which include a two-dimensional material or graphene.

The composite transistor according to Example 1 is the composite transistor including the first structure of the present disclosure. The composite transistor has the overlapping region in which a first active region 11 includes a first A active region 110 and a first B active region 120 overlapping with the first A active region 110, and a first A extending part 111 extends from the first A active region 110 and a first B extending part 121 extends from the first B active region 120. The composite transistor also has the overlapping region in which a second active region 12 includes a second A active region 130 and a second B active region 140 overlapping with the second A active region 130, and a second A extending part 131 extends from the second A active region 130 and a second B extending part 141 extends from the second B active region 140.

The first A active region 110 differs from the first B active region 120 in energy values as defined below.

$E_{V-1A} < E_{V-1B}$ $E_{C-1A} < E_{C-1B}$ where $E_{V-1A}$ denotes the energy value at the upper end of the valence band of the first A active region 110;

$E_{C-1A}$ denotes the energy value at the lower end of the conduction band of the first A active region 110;

$E_{V-1B}$ denotes the energy value at the upper end of the valence band of the first B active region 120; and $E_{C-1B}$ denotes the energy value at the lower end of the conduction band of the first B active region 120. (See FIG. 25A.) Also, the second A active region 130 differs from the second B active region 140 in energy values as defined below.

$E_{V-2A} > E_{V-2B}$ $E_{C-2A} > E_{C-2B}$ where $E_{V-2A}$ denotes the energy value at the upper end of the valence band of the second A active region 130;

$E_{C-2A}$ denotes the energy value at the lower end of the conduction band of the second A active region 130;

$E_{V-2B}$ denotes the energy value at the upper end of the valence band of the second B active region 140; and $E_{C-2B}$ denotes the energy value at the lower end of the conduction band of the second B active region 140. (See FIG. 25C.)

The first A active region 110 containing the first A extending part 111 is an n-type active region, which concretely includes WTe$_2$, 1 nm thick. The first B active region 120 (containing the first B extending part 121) is a p-type active region, which concretely includes MoS$_2$, 1 nm thick. The second A active region 130 (containing the second A extending part 131) is a p-type active region, which concretely includes MoS$_2$, 1 nm thick. The second B active region 140 (containing the second B extending part 141) is an n-type active region, which concretely includes WTe$_2$, 1 nm thick. These materials and thicknesses are merely exemplary. The first A extending part 111 and the first B extending part 121 extend in the same direction as the second A extending part 131 and the second B extending part 141.

In the illustrated example, the second active region 12, the first active region 11, and the control electrode 60 are overlapped with one another in the order mentioned; however, overlapping may be made in the order of the first active region 11, the second active region 12, and the control electrode 60. The first A active region 110 and the first B active region 120 overlap with each other such that the first B active region 120 is close to the control electrode; however, this may be changed such that the first A active region 110 is close to the control electrode. Also, the second A active region 130 and the second B active region 140 overlap with each other such that the second B active region 140 is close to the control electrode; however, this may be changed such that the second A active region 130 is close to the control electrode. The composite transistor is formed on a silicon semiconductor substrate 70 coated with an insulation film (not depicted).

The first active region 11 and the second active region 12 are separated from each other by a second insulation layer 72 of $SiO_2$, 5 nm thick. Also, the first A active region 110 and the first B active region 120 are separated from each other by a first interlayer insulation layer 73 of $HfO_2$, 1 nm thick, which corresponds to the first boundary region. The second A active region 130 and the second B active region 140 are separated from each other by a second interlayer insulation layer 74 of $HfO_2$, 1 nm thick, which corresponds to the second boundary region.

The composite transistor of Example 1 has the first transistor $TR_1$ and the second transistor $TR_2$ which function in the way explained above with reference to FIGS. 25A to 25D.

The first active region 11 and the control electrode 60 overlap with each other in the overlapping region such that the first active region 11 may have its orthogonal projection image which is surrounded by that of the control electrode 60 (see FIG. 4A), or which coincides with that of the control electrode 60 (see FIG. 4B), or which projects from that of the control electrode 60 (see FIG. 4C). Likewise, it has the overlapping region in which the second active region 12 and the control electrode 60 overlap each other such that the second active region 12 may have its orthogonal projection image which is surrounded by that of the control electrode 60 (see FIG. 4A), or which coincides with that of the control electrode 60 (see FIG. 4B), or which projects from that of the control electrode 60 (see FIG. 4C). It is desirable from the standpoint of the control electrode 60 generating a uniform electric field that the first active region 11 and the second active region 12 give the orthogonal projection image which is preferably surrounded by that of the control electrode 60.

Also, the first A active region 110 which constitutes the first active region 11 and the first B active region 120 overlap with each other in the overlapping region such that the overlapping region of the first A active region 110 and the first B active region 120 may have its orthogonal projection image which is surrounded by that of the control electrode 60 (see FIG. 5A), or which coincides with that of the control electrode 60 (see FIG. 5B), or which projects from that of the control electrode 60 (see FIG. 5C). Likewise, it has the overlapping region in which the second A active region 130 which constitutes the second active region 12 and the second B active region 140 overlap each other such that the second A active region 130 and the second B active region 140 may have the orthogonal projection image which is surrounded by that of the control electrode 60 (see FIG. 5A), or which coincides with that of the control electrode 60 (see FIG. 5B), or which projects from that of the control electrode 60 (see FIG. 5C).

The composite transistor of Example 1 is produced by the method which is briefly described below with reference to FIGS. 24A to 24D.

First, the silicon semiconductor substrate 70 with an insulation film formed thereon (not depicted) is coated with $MoS_2$ by CVD method. The coating on the substrate undergoes patterning to desired form to give the second A active region 130 containing the second A extending part 131. (See FIG. 24A.) The patterning may be accomplished by oxygen plasma etching.

The substrate is entirely coated with the second interlayer insulation layer 74, which, after coating with $WTe_2$ by CVD method, undergoes patterning to desired form. Thus, there is obtained the second B active region 140 containing the second B extending part 141. (See FIG. 24B.)

The substrate is entirely coated with the second insulation layer 72, which, after coating with $WTe_2$ by CVD method, undergoes patterning to desired form. Thus, there is obtained the first A active region 110 containing the first A extending part 111. (See FIG. 24C.)

The entire surface is covered with the first interlayer insulation layer 73, which is subsequently coated with $MoS_2$ by CVD method, followed by patterning to desired form. Thus, there is obtained the first B active region 120 containing the first B extending part 121. (See FIG. 24D.)

The entire surface is covered with the insulation layer 71, which is subsequently topped with the control electrode 60. Then, the entire surface is covered with an upper interlayer insulation layer 75, which is subsequently fabricated to form openings above the first A extending part 111, the second A extending part 131, the first B extending part 121, and the second B extending part 141. Then, these openings are filled with a conductive material so that the first electrode 61, the second electrode 62, and the third electrode 63 are formed over the top of the upper interlayer insulation layer 75. (See FIG. 3.)

The composite transistor of Example 1, in which the first transistor and the second transistor include the control electrode, the first active region, and the second active region overlap with one another, is characterized in that the first transistor and the second transistor are controlled by the electric field (or vertical electric field) generated by one control electrode. This contributes to a higher density and a simpler wiring which leads to a reduced parasitic capacity (and hence a reduced power consumption). Another advantage is a considerable overall thickness reduction in the first active region and the second active region, and this permits the planer process in the past to be applied owing to a reduced step and also permits the two transistors to be connected easily by contact connection.

Figure 6:
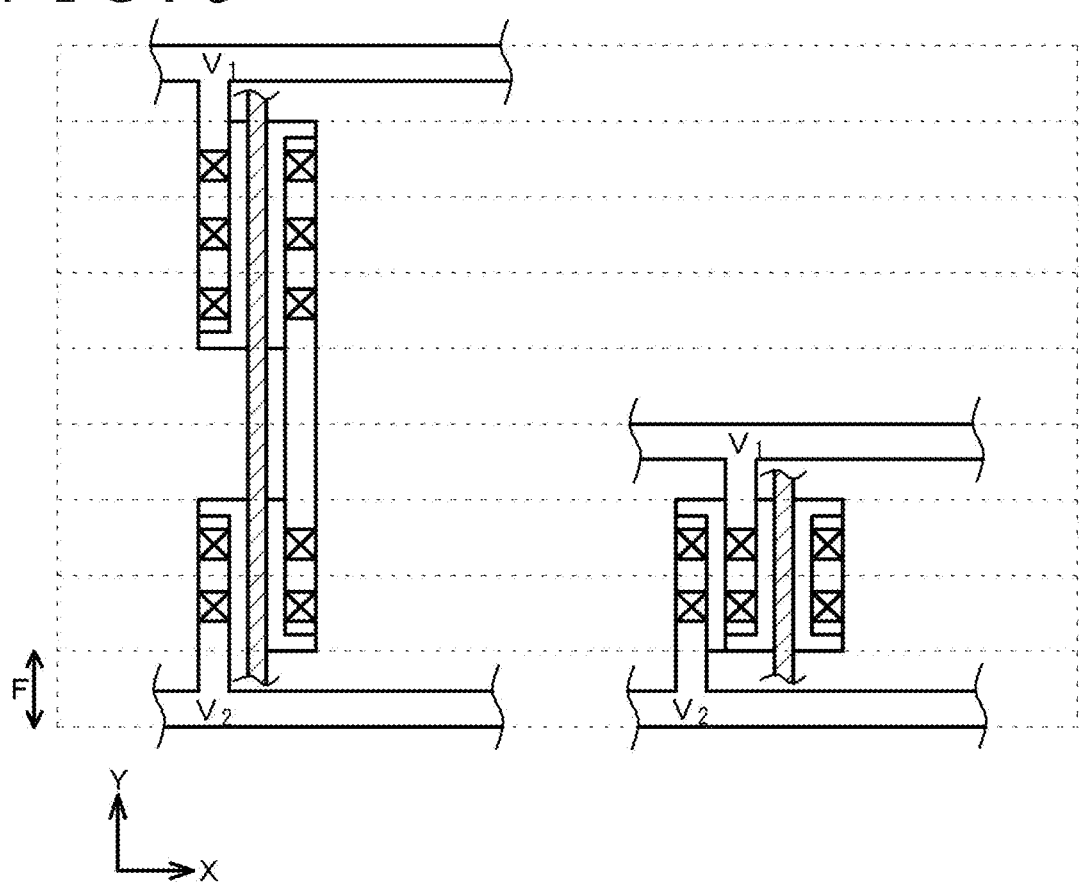
FIG. 6 is a schematic plan view of the composite transistor according to Example 1 and a schematic plan view of a CMOS circuit in the past, which are intended to illustrate their footprint.

The composite transistor of Example 1 is depicted in FIG. 6 (right side) which is a schematic plan view, and the CMOS circuit in the past is depicted in FIG. 6 (left side) which is a schematic plan view. Incidentally, the hatched part in FIG. 6 indicates the control electrode (gate part). It is noted from the plan view that the CMOS circuit in the past is as long as "9F" in the Y direction, with "F" denoting the minimum fabrication size. By contrast, the composite transistor of Example 1 only needs a length of "4F" in the Y direction. Similarly, the CMOS circuit in the past takes a length of "1" in the X direction, whereas the composite transistor of Example 1 takes a length of 1.5. This means that the composite transistor of Example 1 has 0.66 times as large footprint and 1.5 times as high gate density as the CMOS circuit in the past, as calculated below.

$$(4/9) \times 1.5 = 0.66 \text{ and } 1/0.66 = 1.5$$

The result is a higher degree of integration and a uniformity of transistor characteristics because of the absence of scaling.

Example 2

Figure 7A:
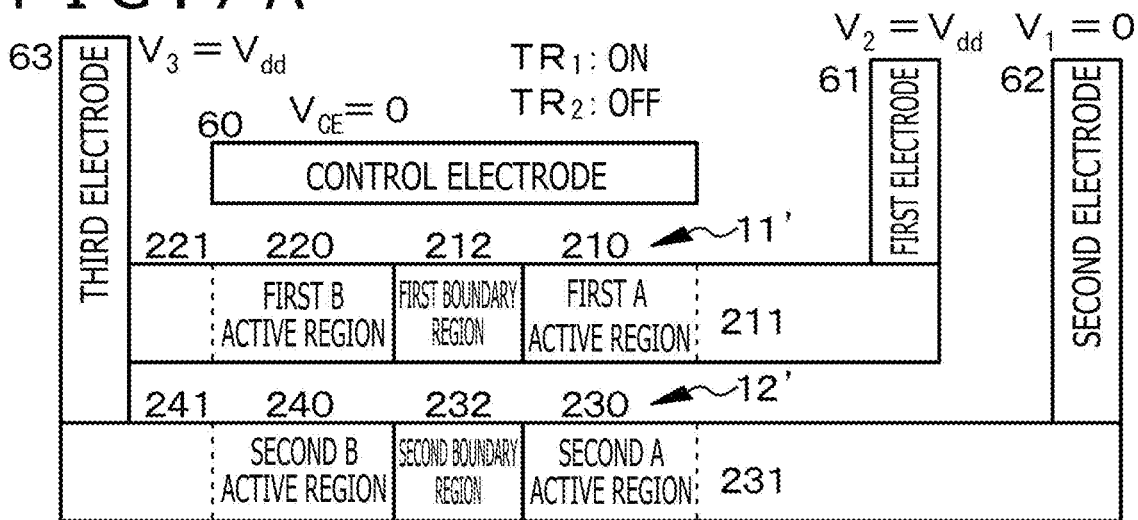
FIGS. 7A to 7C are a conceptual diagram depicting the composite transistor according to Example 2.
Figure 7B:
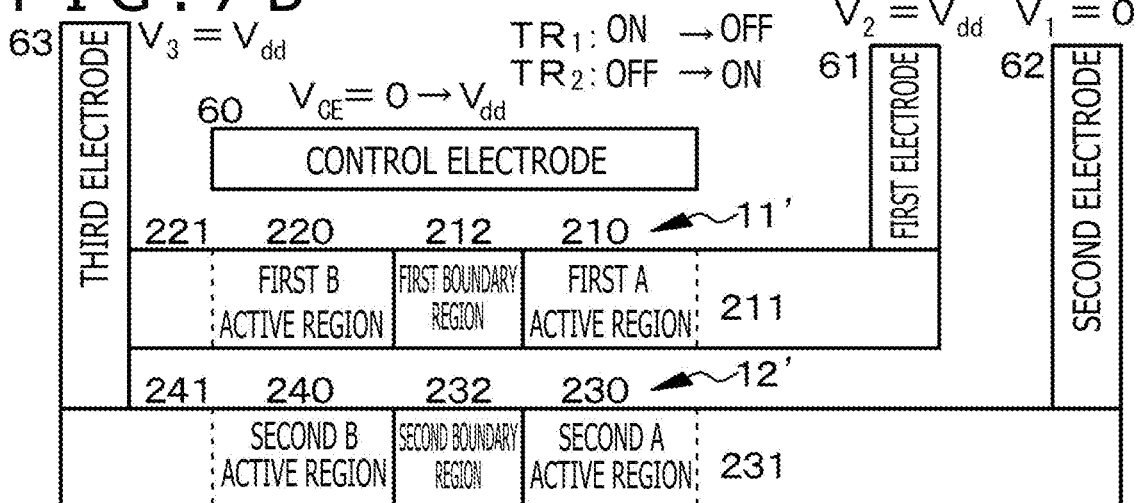
Figure 7C:
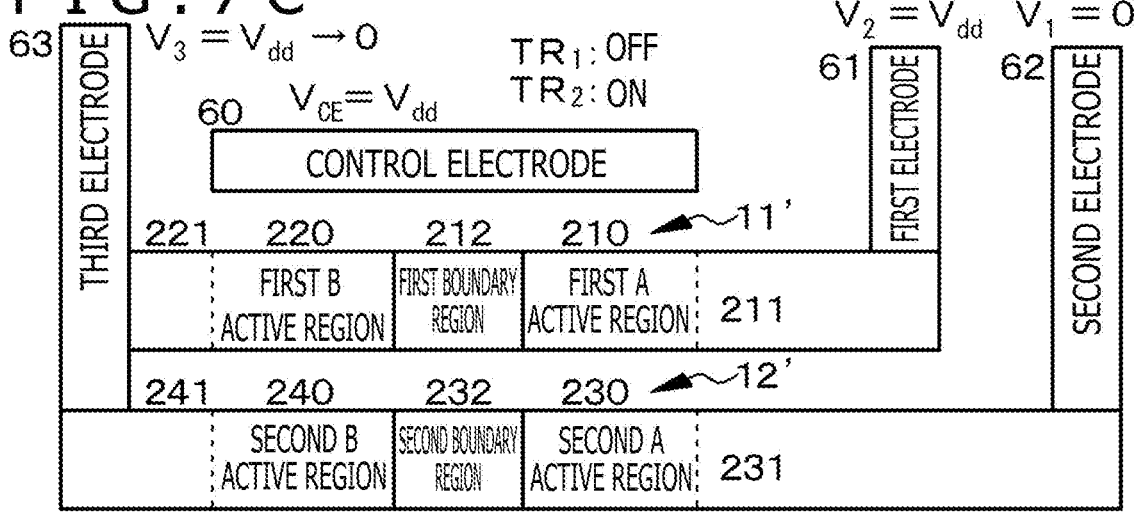
Figure 8A:
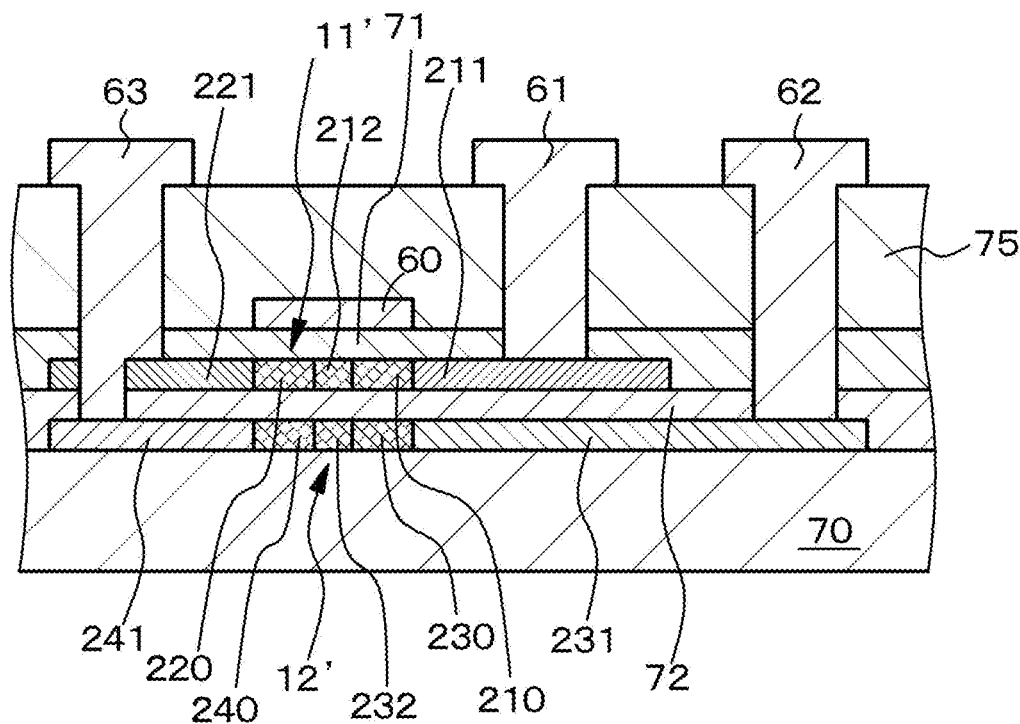
FIGS. 8A and 8B are schematic partly cutaway sectional views of the composite transistor according to Example 2.

Example 2 is concerned with a modification of the composite transistor of Example 1 or the composite transistor including the second structure which is of the present disclosure. The composite transistor of Example 2 is depicted in FIGS. 7A, 7B, and 7C, which are conceptual diagrams. The composite transistor of Example 2 is also depicted in FIG. 8A, which is a schematic partly cutaway sectional view. Incidentally, FIG. 7A depicts that the first transistor is conductive (on) and the second transistor is non-conductive (off). FIG. 7B depicts that the state of the first transistor transitions from conductive (on) to non-conductive (off) and that the state of the second transistor transitions from non-conductive (off) to conductive (on). FIG. 7C depicts that the first transistor is non-conductive (off) and the second transistor is conductive (on).

The composite transistor of Example 2 including the second structure according to the present disclosure has the overlapping region in which the first active region 11' includes a first A active region 210 and a first B active region 220 which is positioned on the same virtual plane as the first A active region 210 and which faces the first A active region 210, a first A extending part 211 extends from the first A active region 210, a first B extending part 221 extends from the first B active region 220, and it also has the overlapping region in which the second active region 12' includes a second A active region 230 and a second B active region 240 which is positioned on the same virtual plane as the second A active region 230 and which faces the second A active region 230, a second A extending part 231 extends from the second A active region 230, a second B extending part 241 extends from the second B active region 240.

The first A active region 210 differs from the first B active region 220 in energy values as defined below.

$E_{V-1A} < E_{V-1B}$ $E_{C-1A} < E_{C-1B}$ where $E_{V-1A}$ denotes the energy value at the upper end of the valence band of the first A active region 210;

$E_{C-1A}$ denotes the energy value at the lower end of the conduction band of the first A active region 210;

$E_{V-1B}$ denotes the energy value at the upper end of the valence band of the first B active region 220; and $E_{C-1B}$ denotes the energy value at the lower end of the conduction band of the first B active region 220.

Also, the second A active region 230 differs from the second B active region 240 in energy values as defined below.

$E_{V-2A} > E_{V-2B}$ $E_{C-2A} > E_{C-2B}$ where $E_{V-2A}$ denotes the energy value at the upper end of the valence band of the second A active region 230;

$E_{C-2A}$ denotes the energy value at the lower end of the conduction band of the second A active region 230;

$E_{V-2B}$ denotes the energy value at the upper end of the valence band of the second B active region 240; and $E_{C-2B}$ denotes the energy value at the lower end of the conduction band of the second B active region 240.

The composite transistor of Example 2 has the energy values defined below when it is non-conductive.

$E_{C-1B} > E_{C-1A} > E_{V-1B} > E_{V-1A}$, and $E_{C-2A} > E_{C-2B} > E_{V-2A} > E_{V-2B}$ It also has the energy values defined below when it is conductive.

Figure 8B:
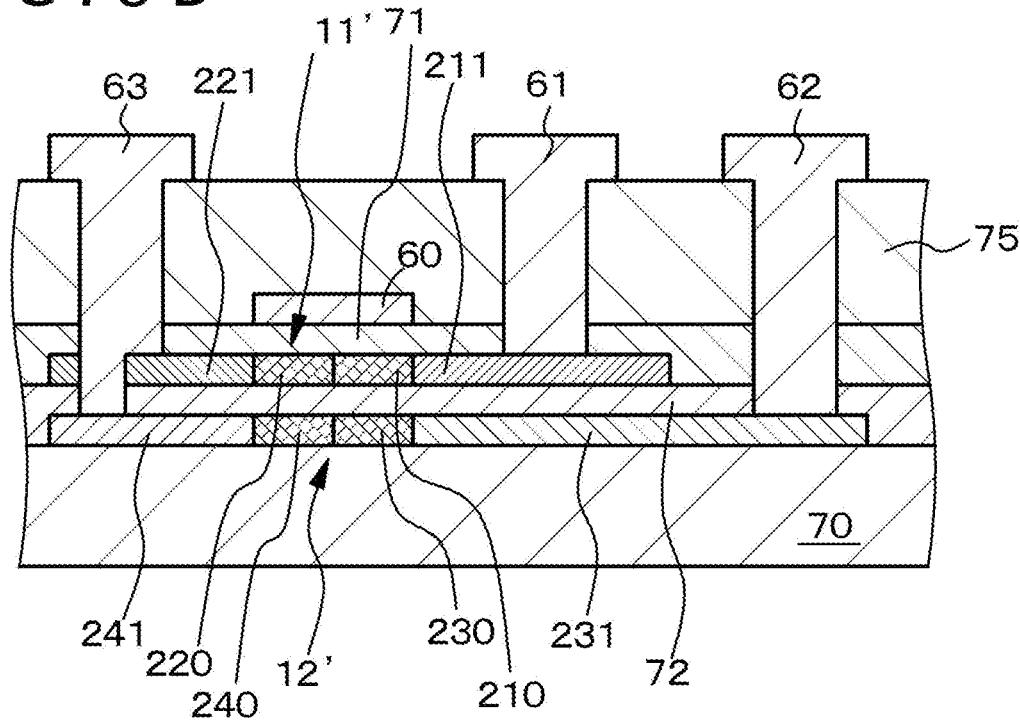

$E_{C-1B} > E_{V-1B} > E_{C-1A} > E_{V-1A}$, and $E_{C-2A} > E_{V-2A} > E_{C-2B} > E_{V-2B}$ The first active region 11' and the second active region 12' are separate from each other, with the second insulation layer 72 interposed between them. Also, the first A active region 210 and the first B active region 220 are separate from each other, with a first boundary region 212 interposed between them. The second A active region 230 and the second B active region 240 are separate from each other with a second boundary region 232 interposed between them. Incidentally, as depicted in FIG. 8B, the first A active region 210 and the first B active region 220 may be in contact with each other, and the second A active region 230 and the second B active region 240 may not be in contact with each other.

The first A active region 210 (containing the first A extending part 211) is an n-type active region, which concretely includes $WTe_2$, 3 nm thick. The first B active region 220 (containing the first B extending part 221) is a p-type active region, which concretely includes $WTe_2$, 3 nm thick. The second A active region 230 (containing the second A extending part 231) is a p-type active region, which concretely includes $MoS_2$, 3 nm thick. The second B active region 240 (containing the second B extending part 241) is an n-type active region, which concretely includes $MoS_2$, 3 nm thick. The first boundary region 212 is an intrinsic active region, which concretely includes $WTe_2$, 3 nm thick. The second boundary region 232 is also an intrinsic active region which concretely includes $MoS_2$, 3 nm thick.

The composite transistor of Example 2 is produced by the method which is briefly described below.

First, the silicon semiconductor substrate 70 with an insulation film formed thereon is coated with $MoS_2$ by CVD method. The coating on the substrate undergoes patterning to desired form to give the second A active region 230 (containing the second A extending part 231), the second B active region 240 (containing the second B extending part 241) and the region which becomes the second boundary region 232. Chemical doping is performed to form the second A active region 230 (containing the second A extending part 231) which is a p-type active region, and also to form the second B active region 240 (containing the second B extending part 241) which is an n-type active region. Incidentally, the chemical doping should preferably be performed through a mask layer for protection from unnecessary doping.

Next, the entire surface is coated with the second insulation layer 72, which is subsequently coated with $WTe_2$ by CVD method. Coating layer undergoes patterning to desired form to obtain the first A active region 210 (containing the first A extending part 211), the first B active region 220 (containing the first B extending part 221), and the region for the first boundary region 212. Chemical doping is performed to form the first A active region 210 as an n-type active region (containing the first A extending region 211) and the first B active region 220 as a p-type active region (containing the first B extending region 221).

Finally, the entire surface is coated sequentially with the insulation layer 71 and the control electrode 60, and the entire surface is further coated with the upper interlayer insulation layer 75, in which openings are formed at the positions above the first A extending part 211, the second A extending part 231, the first B extending part 221, and the second B extending part 241. These openings are filled with a conductive material to form the first electrode 61, the second electrode 62, and the third electrode 63 on the top of the upper interlayer insulation layer 75.

Example 3

Figure 9A:
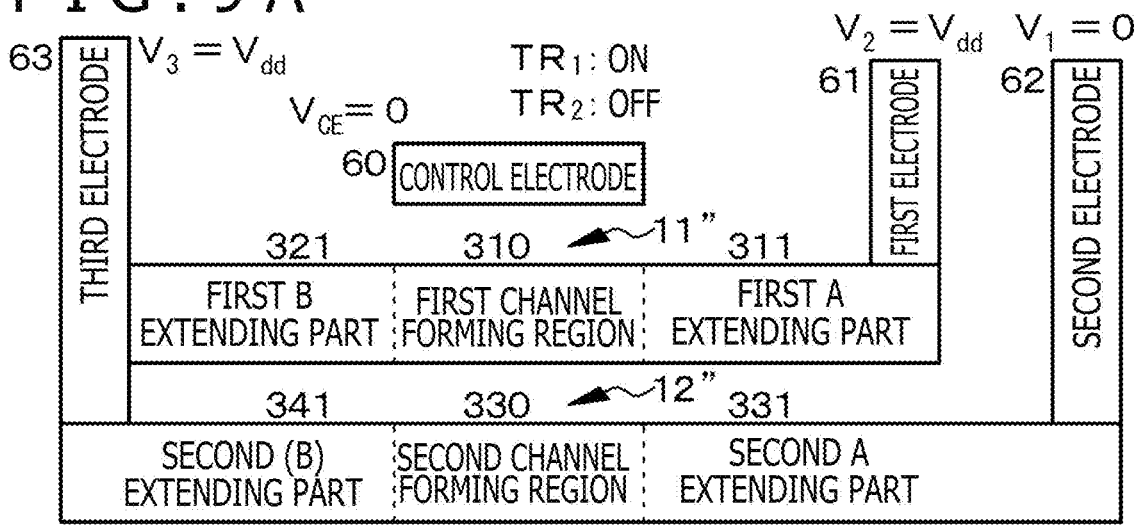
FIGS. 9A to 9C are conceptual diagrams depicting the composite transistor according to Example 3.
Figure 9B:
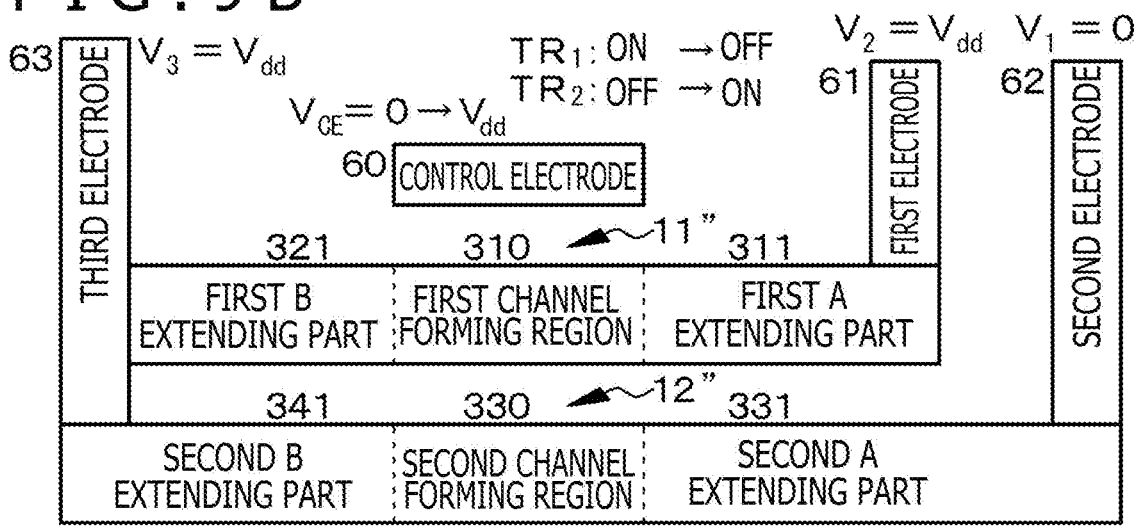
Figure 9C:
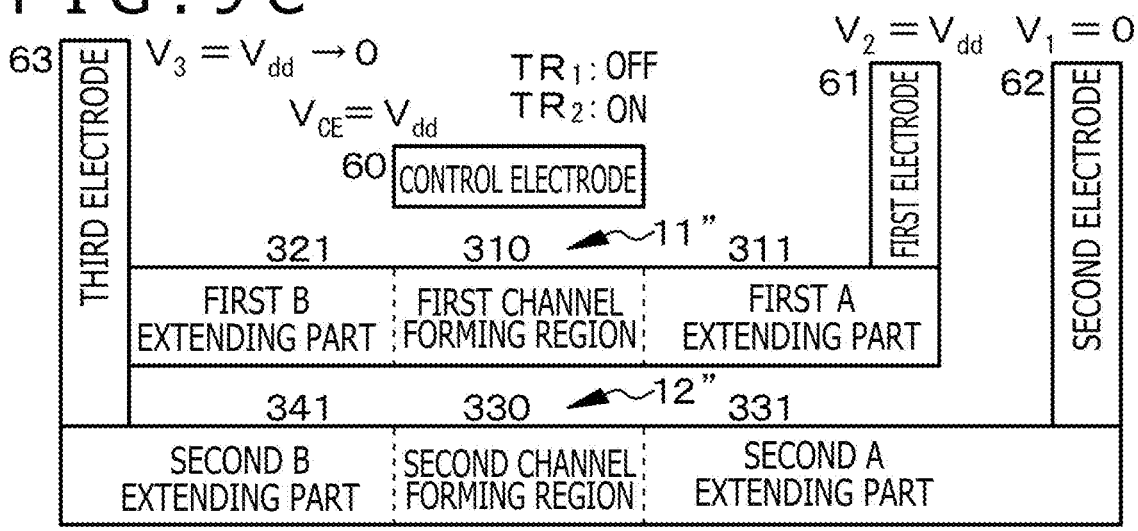
Figure 10:
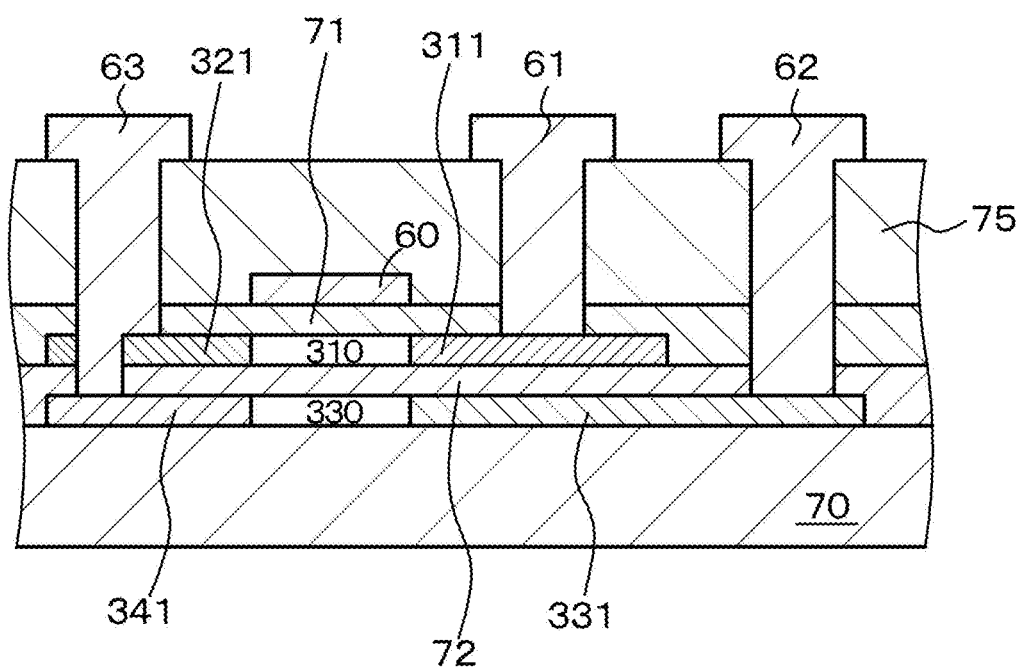
FIG. 10 is a schematic partly cutaway sectional view of the composite transistor according to Example 3.

Example 3 is also concerned with a modification of the composite transistor of Example 1 or the composite transistor including the third structure of the present disclosure. The composite transistor of Example 3 is depicted in FIGS. 9A to 9C, which are conceptual diagrams. The composite transistor of Example 3 is also depicted in FIG. 10, which is a schematic partly cutaway sectional view. Incidentally, FIG. 9A depicts a state in which the first transistor is conductive (on) and the second transistor is non-conductive (off). FIG. 9B depicts a state in which the first transistor transitions from conductive (on) to non-conductive (off) and the second transistor transitions from non-conductive (off) to conductive (on). FIG. 9C depicts a state in which the first transistor is non-conductive (off) and the second transistor is conductive (on).

The composite transistor according to Example 3 including the third structure of the present disclosure has an overlapping region in which the first active region 11'' includes a first channel forming region 310, the first A extending part 311 extends from one end of the first channel forming region 310, the first B extending part 321 extends from the other end of the first channel forming region 310, and also has an overlapping region in which the second active region 12'' includes a second channel forming region 330, the second A extending part 311 extends from one end of the second channel forming region 330, and the second B extending part 341 extends from the other end of the second channel forming region 330.

When the control electrode 60 is given the first voltage $V_1$, the first transistor $TR_1$ becomes conductive and the second transistor $TR_2$ becomes non-conductive, and when the control electrode 60 is given the second voltage $V_2$ ($>V_1$) higher than the first voltage $V_1$, the second transistor $TR_2$ becomes conductive and the first transistor $TR_1$ becomes non-conductive. Thus, the composite transistor of Example 3 functions basically in the same way as the field-effect transistor in the past.

The composite transistor of Example 3 is constructed such that the first active region 11'' and the second active region 12'' are separated from each other by the second insulation layer 72. In the composite transistor of Example 3, the first active region 11'' (the first channel forming region 310) is a 3-nm thick layer of $WTe_2$, and the second active region 12'' (the second channel forming region 330) is a 3-nm thick layer of $MoS_2$. Each of the first A extending part 311 and the first B extending part 321 is a 3-nm thick layer of $WTe_2$ doped with a p-type impurity, and each of the second A extending part 331 and the second B extending part 341 is a 3-nm thick layer of $MoS_2$ doped with an n-type impurity.

The composite transistor of Example 3 is produced by a method which is briefly described below.

That is, the silicon semiconductor substrate 70 with an insulation film formed thereon is coated with $MoS_2$ by the CVD method. The coating on the substrate undergoes patterning into the desired shape to form the second channel forming region 330 and the region which becomes the second A extending part 331 and the second B extending part 341. The second A extending part 331 and the second B extending part 341 (containing an n-type impurity) are formed by an ion injection method. Incidentally, the ion injection method should be performed through a mask layer for protection of an area from unnecessary ion injection.

Next, the entire surface is coated with the second insulation layer 72, which is subsequently coated with $WTe_2$ by CVD method. Coating layer undergoes patterning into the desired shape to form the first channel forming region 310 and the region which becomes the first A extending part 311 and the first B extending part 321. Then, the first A extending part 311 and the first B extending part 321 (containing a p-type impurity) are formed by the ion injection method.

Finally, the entire surface is coated sequentially with the insulation layer 71 and the control electrode 60, and the entire surface is further coated with the upper interlayer insulation layer 75, in which openings are formed at the positions above the first A extending part 311, the second A extending part 331, the first B extending part 321, and the second B extending part 341. These openings are filled with a conductive material to form the first electrode 61, the second electrode 62, and the third electrode 63 on the top of the upper interlayer insulation layer 75.

Example 4

Example 4 is a modification of Examples 1 to 3. It is concerned with the logic circuit including the composite transistors according to Examples 1 to 3.

Figure 11A:
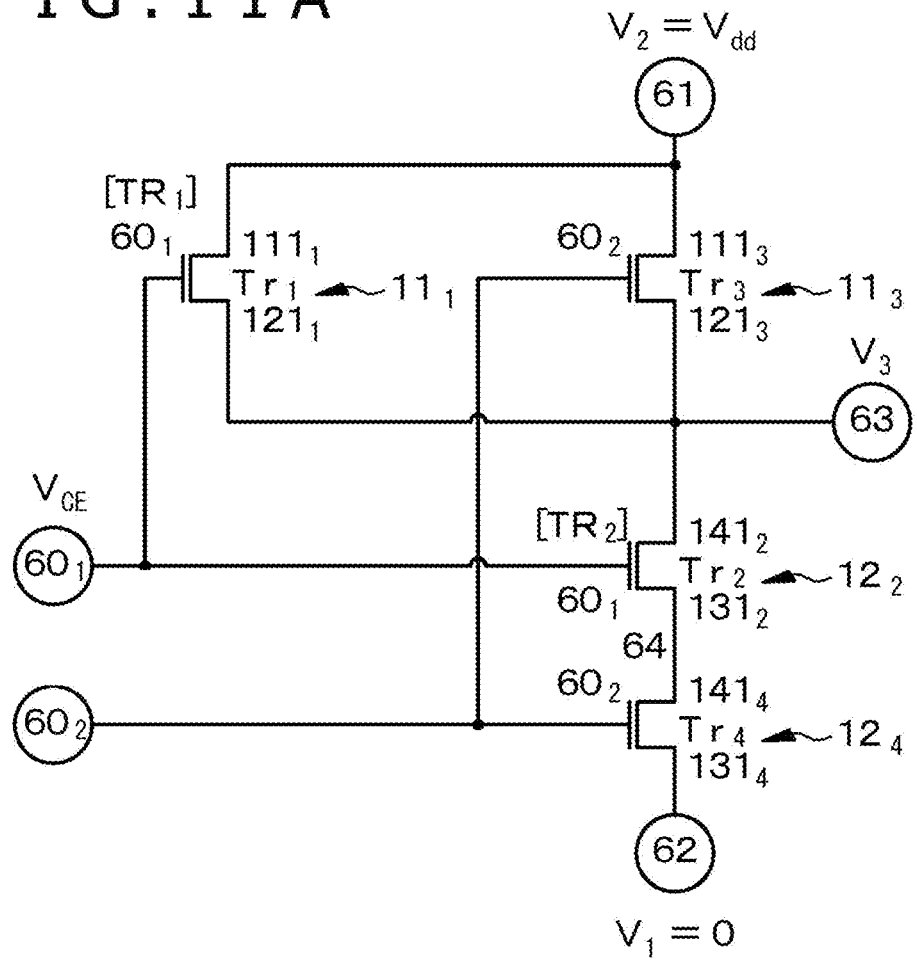
FIG. 11A is an equivalent circuit of a NAND circuit which is formed on the basis of the composite transistors according to Examples 1, 2, and 3.
Figure 11B:
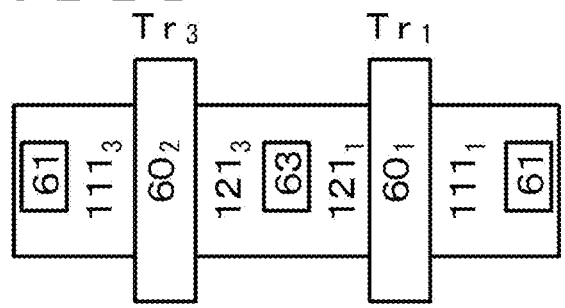
FIGS. 11B and 11C are schematic diagrams depicting an arrangement of constituents of the NAND circuit including the composite transistor according to Example 1.
Figure 11C:
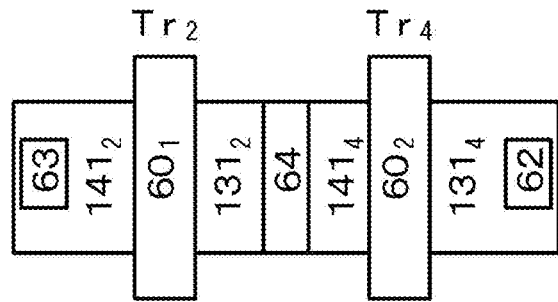
Figure 12A:
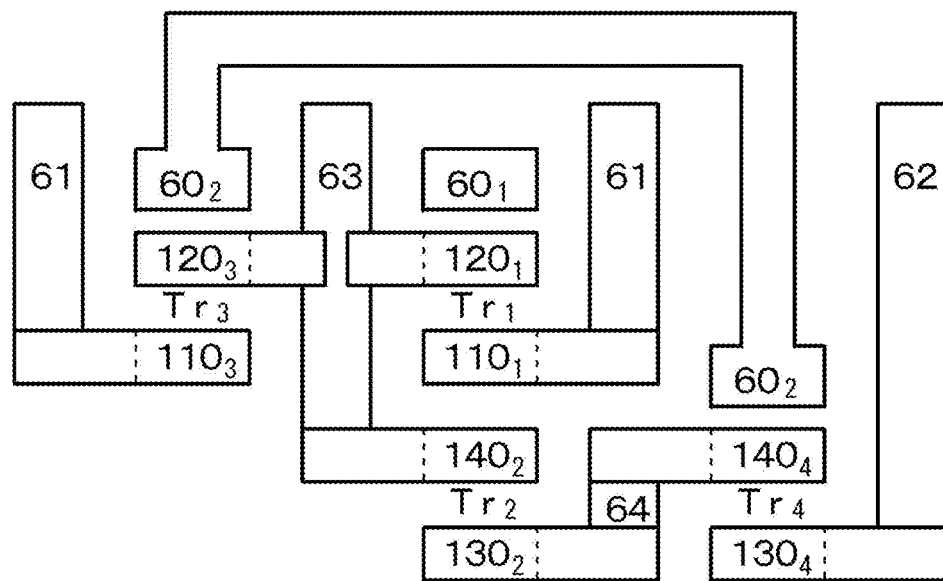
FIGS. 12A to 12C are conceptual partly cutaway sectional views of the NAND circuits formed on the basis of the composite transistors according to Example 1, Example 2, and Example 3, respectively.
Figure 12B:
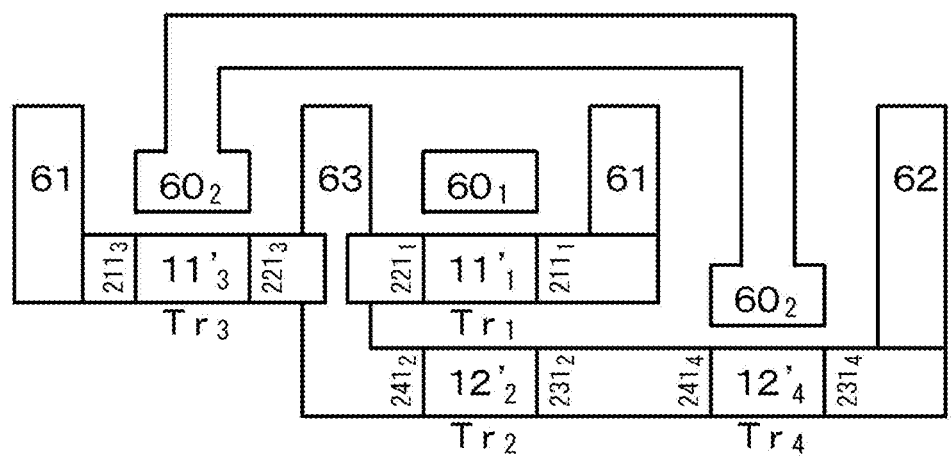
Figure 12C:
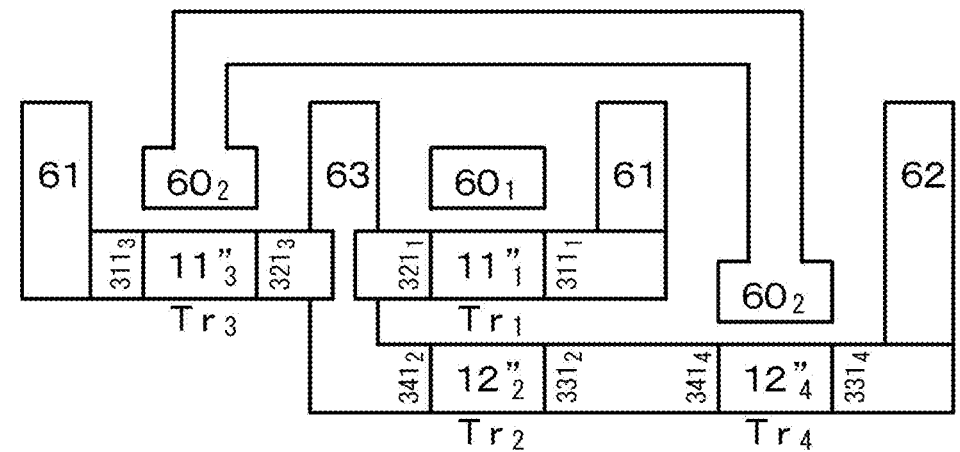

FIG. 11A is an equivalent circuit diagram of the NAND circuit which is formed on the basis of the composite transistors of Examples 1 to 3. FIGS. 11B and 11C are schematic diagrams depicting the arrangement of the constituents of the NAND circuit which is configured on the basis of the composite transistor of Example 1. Incidentally, FIGS. 11B and 11C overlap with each other in the actual structure. FIGS. 12A to 12C are conceptual partly cutaway sectional views each depicting the NAND circuit which is formed on the basis of the composite transistor according to Examples 1 to 3. Incidentally, the equivalent circuit diagram depicted in FIG. 11A is based on the composite transistor of Example 1.

The NAND circuit includes four transistors $Tr_1$, $Tr_2$, $Tr_3$, and $Tr_4$. The first and second transistors $TR_1$ and $Tr_2$ include the composite transistor of the present disclosure. In other words, the first and second transistors $Tr_1$ and $Tr_2$ correspond to the first and second transistors $TR_1$ and $TR_2$, respectively.

The first transistor $TR_1$ ($Tr_1$) includes a control electrode $60_1$, a first active region $11_1$, $11'_1$, $11''_1$, a first A extending part $111_1$, $211_1$, $311_1$, and a first B extending part $121_1$, $221_1$, $321_1$. Also, the second transistor $TR_2$ ($Tr_2$) includes the control electrode $60_1$, a second active region $12_2$, $12'_2$, $12''_2$, a second A extending part $131_2$, $231_2$, $331_2$, and a second B extending part $141_2$, $241_2$, $341_2$.

Moreover, a third transistor $Tr_3$ constituting the NAND circuit substantially includes the first transistor $TR_1$. To be concrete, it includes a control electrode $60_2$, a first active region $11_3$, $11'_3$, $11''_3$, a first A extending part $111_3$, $211_3$, $311_3$, and a first B extending part $121_3$, $221_3$, $321_3$. Also, a fourth transistor $Tr_4$ constituting the NAND circuit substantially includes the second transistor $TR_2$. To be concrete, it includes the control electrode $60_2$, a second active region $12_4$, $12'_4$, $12''_4$, a second A extending part $131_4$, $231_4$, $331_4$, and a second B extending part $141_4$, $241_4$, $341_4$. Incidentally, the second A extending part $131_2$ and the second B extending part $141_4$ connect to each other through a connecting part 64.

Figure 13:
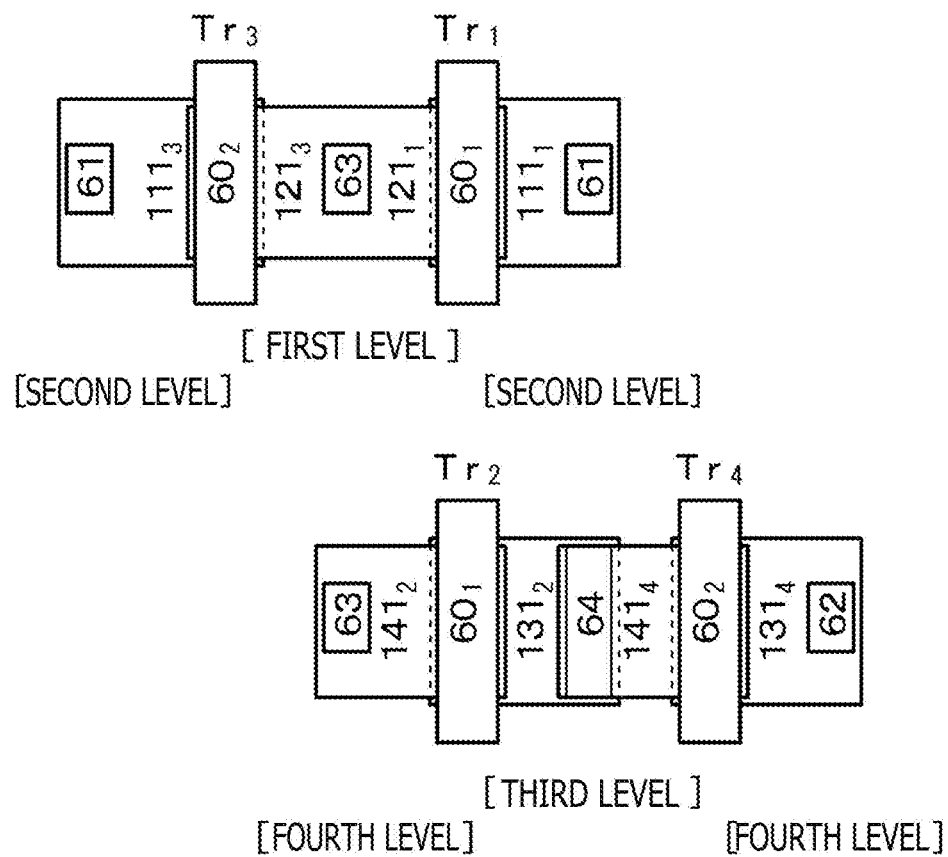
FIG. 13 is a schematic diagram depicting the NAND circuit formed on the basis of the composite transistor according to Example 1, with its active regions, etc. being cut along virtual planes at four levels.

FIG. 13 is a schematic diagram depicting the NAND circuit formed on the basis of the composite transistor according to Example 1, with its active regions, etc. being cut along virtual planes at four levels. Incidentally, FIGS. 13, 14A, 14B, 17, 18A, 18B, 23A, and 23B also depict the control electrode.

Here, FIG. 13 (upper part) depicts a first B active region $120_1$, $120_3$ and the first B extending part $121_1$, $121_3$, which are positioned at the first level closest to the level of the control electrode and also depicts a first A active region $110_1$, $110_3$ and the first A extending part $111_1$, $111_3$, which are positioned at the second level below the first level. Also, FIG. 13 (lower part) depicts the second B active region $140_2$, $140_4$ and the second B extending part $141_2$, $141_4$, which are positioned at the third level below the second level and also depicts the second A active region $130_2$, $130_4$ and the second A extending part $131_2$, $131_4$, which are positioned at the fourth level which is the lowest level below the third level.

Figure 14A:
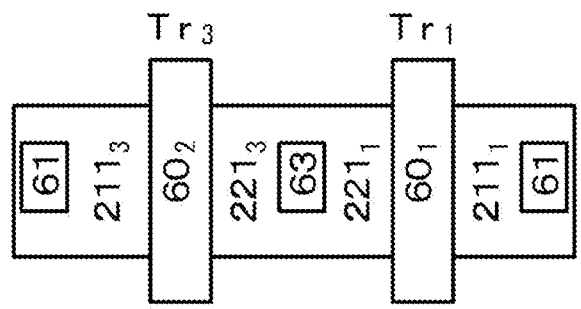
FIGS. 14A and 14B are schematic diagrams each depicting the NAND circuit formed on the basis of the composite transistor according to Example 2 and Example 3, respectively, with its active regions, etc. being cut along virtual planes at two levels.
Figure 14A:
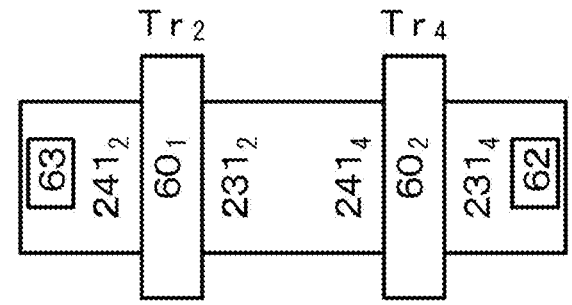

FIG. 14A is a schematic diagram depicting the NAND circuit formed on the basis of the composite transistor according to Example 2, with its active regions, etc. being cut along virtual planes at two levels. FIG. 14A (upper part) depicts a first A active region $210_1$, $210_3$, a first B active region $220_1$, $220_3$, a first A extending part $211A_1$, $211A_3$, and a first B extending part $221B_1$, $221B_3$, which are positioned at the first level closest to the level of the control electrode. Also, FIG. 14A (lower part) depicts a second A active region $230_2$, $230_4$, a second B active region $240_2$, $240_4$, a second A extending part $231A_2$, $231A_4$, and a second B extending part $241B_2$, $241B_4$, which are positioned at the second level below the first level.

Figure 14B:
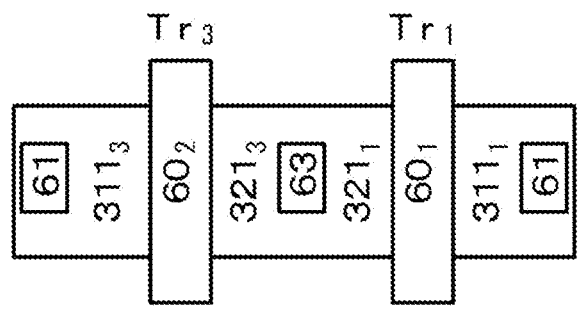
Figure 14B:
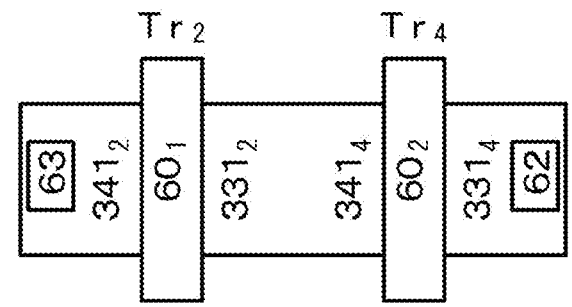

In addition, FIG. 14B is a schematic diagram depicting the NAND circuit formed on the basis of the composite transistor according to Example 3, with its active regions, etc. being cut along virtual planes at two levels. FIG. 14B (upper part) depicts a first channel forming region $310_1$, $310_3$, a first A extending part $311A_1$, $311A_3$, and a first B extending part $321B_1$, $321B_3$, which are positioned at the first level closest to the level of the control electrode. Also, FIG. 14B (lower part) depicts a second channel forming region $330_2$, $330_4$, a second A extending part $331A_2$, $331A_4$, and a second B extending part $341B_2$, $341B_4$, which are positioned at the second level below the first level.

Figure 15A:
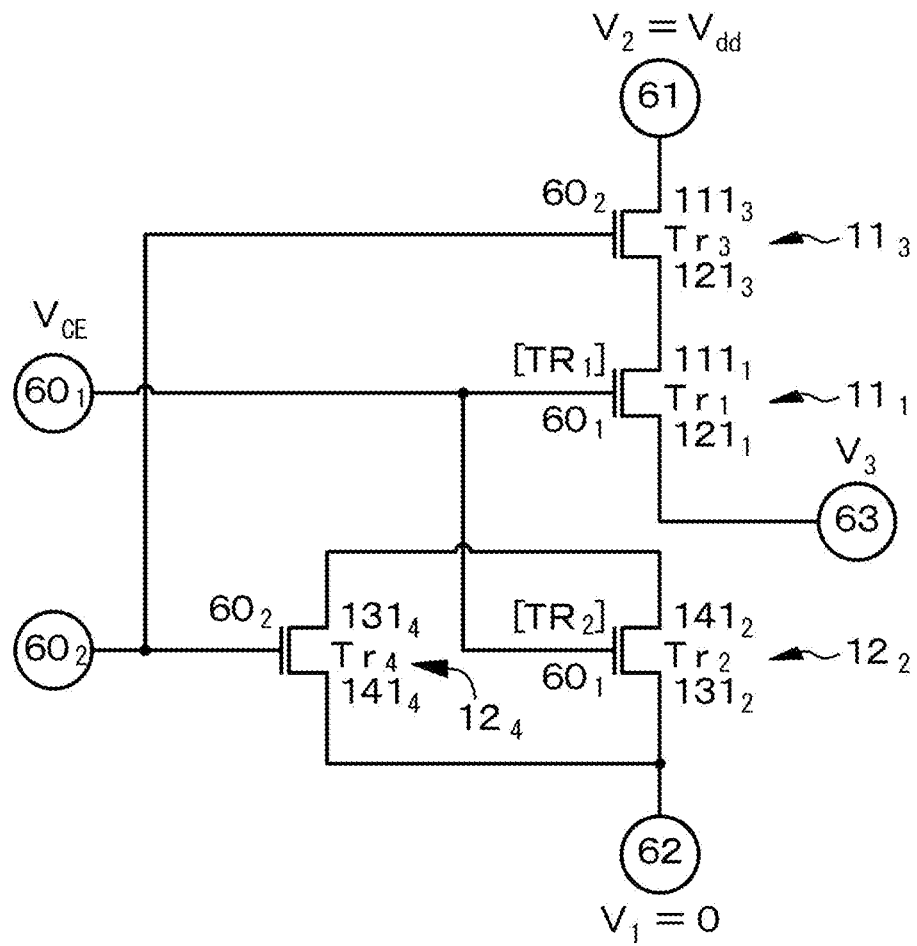
FIG. 15A is an equivalent circuit of a NOR circuit which is formed on the basis of the composite transistors according to Example 1, Example 2, and Example 3.
Figure 15B:
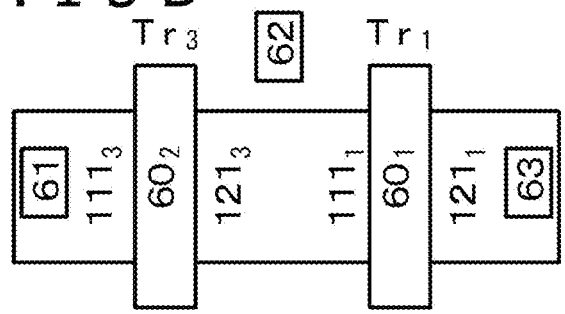
FIGS. 15B and 15C are schematic diagrams depicting an arrangement of constituents of the NOR circuit including the composite transistor according to Example 1.
Figure 15C:
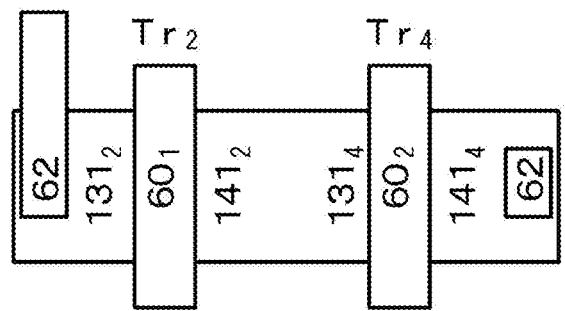
Figure 16A:
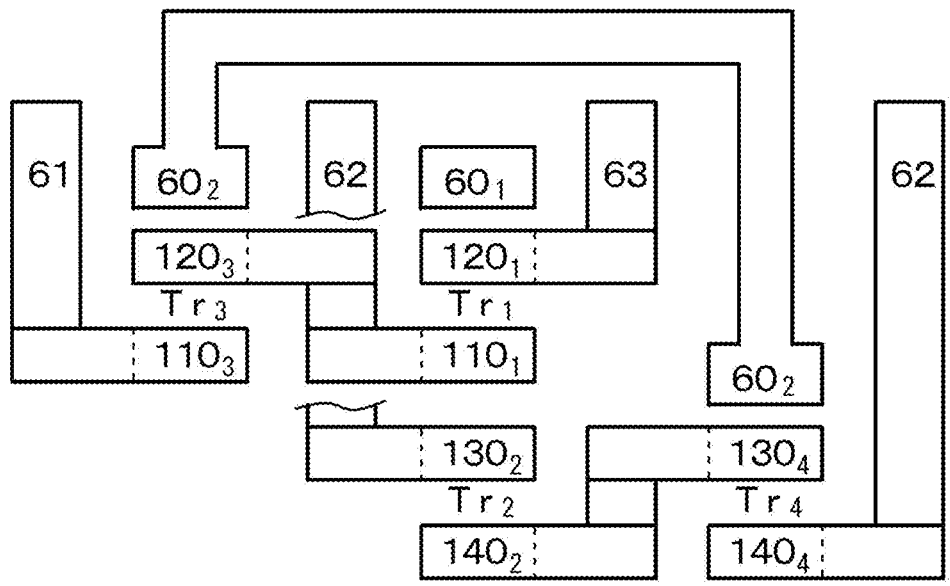
FIGS. 16A to 16C are conceptual partly cutaway sectional views of the NOR circuits formed on the basis of the composite transistors according to Example 1, Example 2, and Example 3, respectively.
Figure 16B:
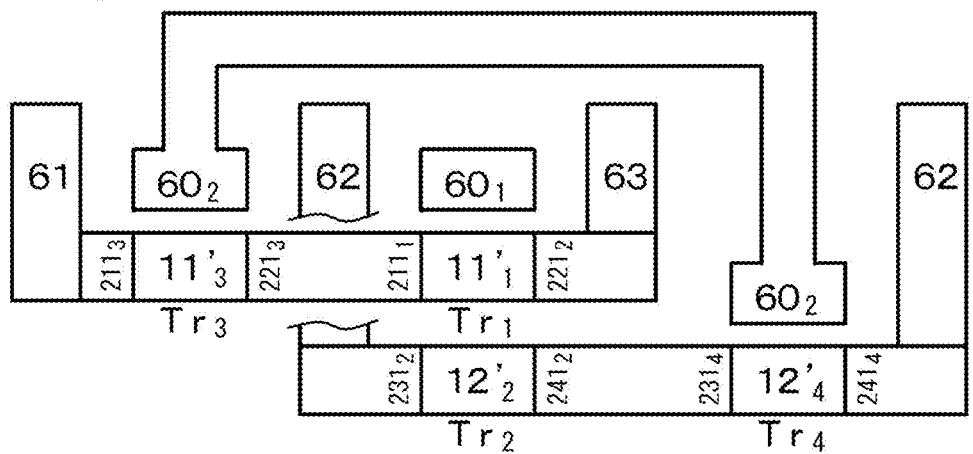
Figure 16C:
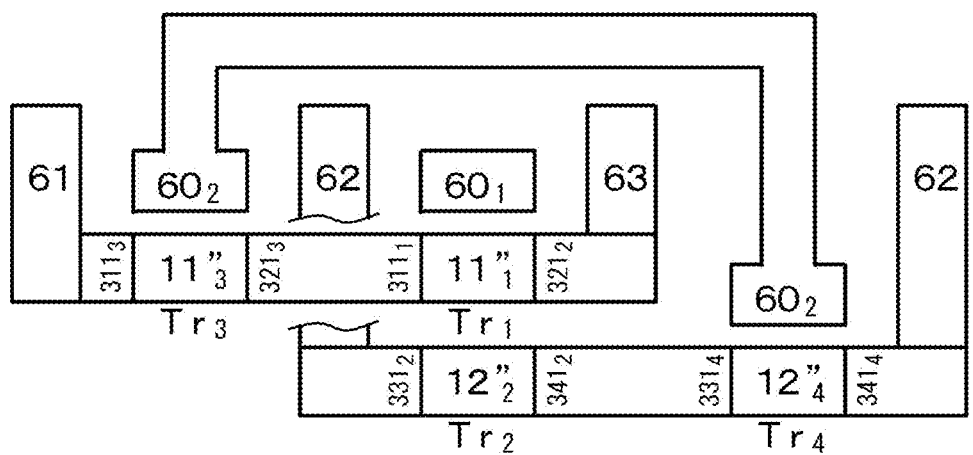

FIG. 15A is an equivalent circuit diagram of the NOR circuit which is formed on the basis of the composite transistors of Examples 1 to 3. FIGS. 15B and 15C are schematic diagrams depicting the arrangement of the constituents of the NOR circuit which is formed on the basis of the composite transistor of Example 1. Incidentally, FIGS. 15B and 15C overlap with each other in the actual structure. FIGS. 16A to 16C are conceptual partly cutaway sectional views each depicting the NOR circuit which is formed on the basis of the composite transistor according to Examples 1 to 3. Incidentally, the equivalent circuit diagram depicted in FIG. 15A is based on the composite transistor of Example 1.

The NOR circuit includes four transistors $Tr_1$, $Tr_2$, $Tr_3$, and $Tr_4$. The first and second transistors $Tr_1$ and $Tr_2$ include the composite transistor of the present disclosure. In other words, the first and second transistors $Tr_1$ and $Tr_2$ correspond to the first and second transistors $TR_1$ and $TR_2$, respectively.

The first transistor $TR_1$ ($Tr_1$) includes the control electrode $60_1$, the first active region $11_1$, $11'_1$, $11''_1$, the first A extending part $111_1$, $211_1$, $311_1$, and the first B extending part $121_1$, $221_1$, $321_1$. Also, the second transistor $TR_2$ ($Tr_2$) includes the control electrode $60_1$, the second active region $12_2$, $12'_2$, $12''_2$, the second A extending part $131_2$, $231_2$, $331_2$, and the second B extending part $141_2$, $241_2$, $341_2$.

Moreover, the third transistor $Tr_3$ constituting the NOR circuit substantially includes the first transistor $TR_1$. To be concrete, it includes the control electrode $60_2$, the first active region $11_3$, $11'_3$, $11''_3$, the first A extending part $111_3$, $211_3$, $311_3$, and the first B extending part $121_3$, $221_3$, $321_3$. Also, the fourth transistor $Tr_4$ constituting the NOR circuit substantially includes the second transistor $TR_2$. To be concrete, it includes the control electrode $60_2$, the second active region $12_4$, $12'_4$, $12''_4$, the second A extending part $131_4$, $231_4$, $331_4$, and the second B extending part $141_4$, $241_4$, $341_4$.

Figure 17:
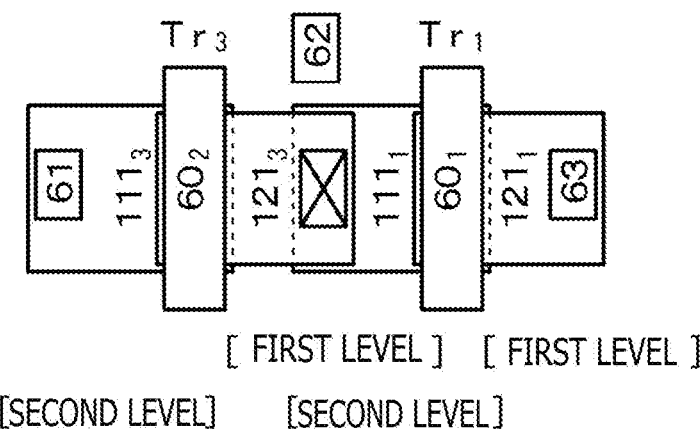
FIG. 17 is a schematic diagram depicting the NOR circuit formed on the basis of the composite transistor according to Example 1, with its active regions, etc. being cut along virtual planes at four levels.
Figure 17:
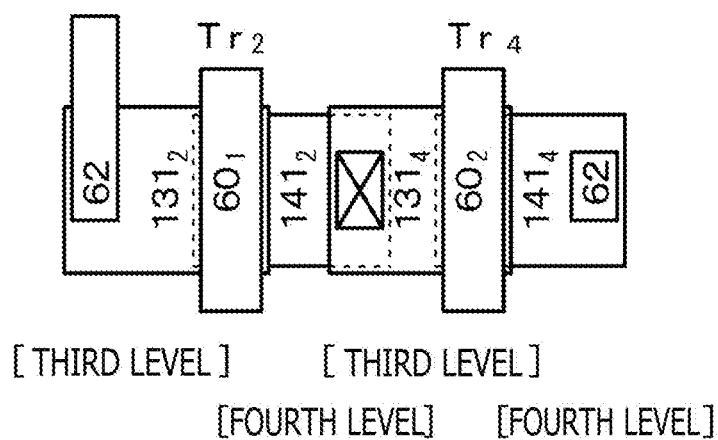

FIG. 17 is a schematic diagram depicting the NOR circuit formed on the basis of the composite transistor according to Example 1, with its active regions, etc. being cut along virtual planes at four levels.

Here, FIG. 17 (upper part) depicts the first A active region $110_1$, the first B active region $120_3$, the first A extending part $111_1$, and the first B extending part $121_3$, which are positioned at the first level closest to the level of the control electrode, and also depicts the first B active region $120_1$, the first A active region $110_3$, the first B extending part $121_1$, and the first A extending part $113_3$, which are positioned at the second level below the first level. Also, FIG. 17 (lower part) depicts the second B active region $140_2$, $140_4$ and the second B extending part $141_2$, $141_4$, which are positioned at the third level below the second level and also depicts the second A active region $130_2$, $130_4$ and the second A extending part $131_2$ $131_4$, which are positioned at the fourth level which is the lowest level below the third level.

Figure 18A:
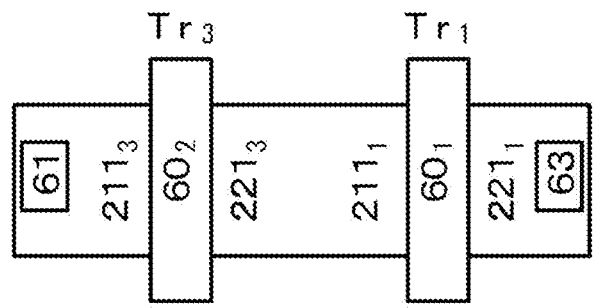
FIGS. 18A and 18B are schematic diagrams each depicting the NOR circuit formed on the basis of the composite transistor according to Example 2 and Example 3, respectively, with its active regions, etc. being cut along virtual planes at two levels.
Figure 18A:
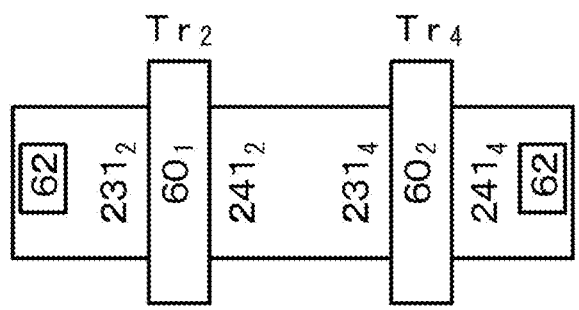

In addition, FIG. 18A is a schematic diagram depicting the NOR circuit formed on the basis of the composite transistor according to Example 2, with its active regions, etc. being cut along virtual planes at two levels. FIG. 18A (upper part) depicts the first A active region $210_1$, $210_3$, the first A extending part $211A_1$, $211A_3$, and the first B extending part $221B_1$, $221B_3$, which are positioned at the first level closest to the level of the control electrode. Also, FIG. 18A (lower part) depicts the second A active region $230_2$, $230_4$, the second A extending part $231A_2$, $231A_4$, and the second B extending part $241B_2$, $241B_4$, which are positioned at the second level below the first level.

Figure 18B:
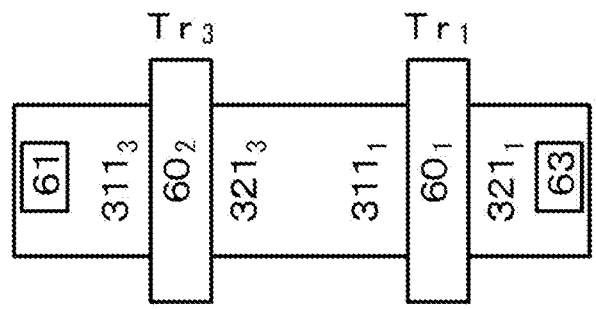
Figure 18B:
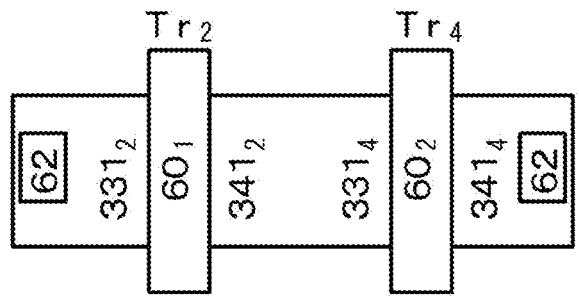

In addition, FIG. 18B is a schematic diagram depicting the NOR circuit formed on the basis of the composite transistor according to Example 3, with its active regions, etc. being cut along virtual planes at two levels. FIG. 18B (upper part) depicts the first channel forming region $310_1$, $310_3$, the first A extending part $311A_1$, $311A_3$, and the first B extending part $321B_1$, $321B_3$, which are positioned at the first level closest to the level of the control electrode. Also, FIG. 18B (lower part) depicts the second channel forming region $330_2$, $330_4$, the second A extending part $331A_2$, $331A_4$, and the second B extending part $341B_2$, $341B_4$, which are positioned at the second level below the first level.

Figure 19:
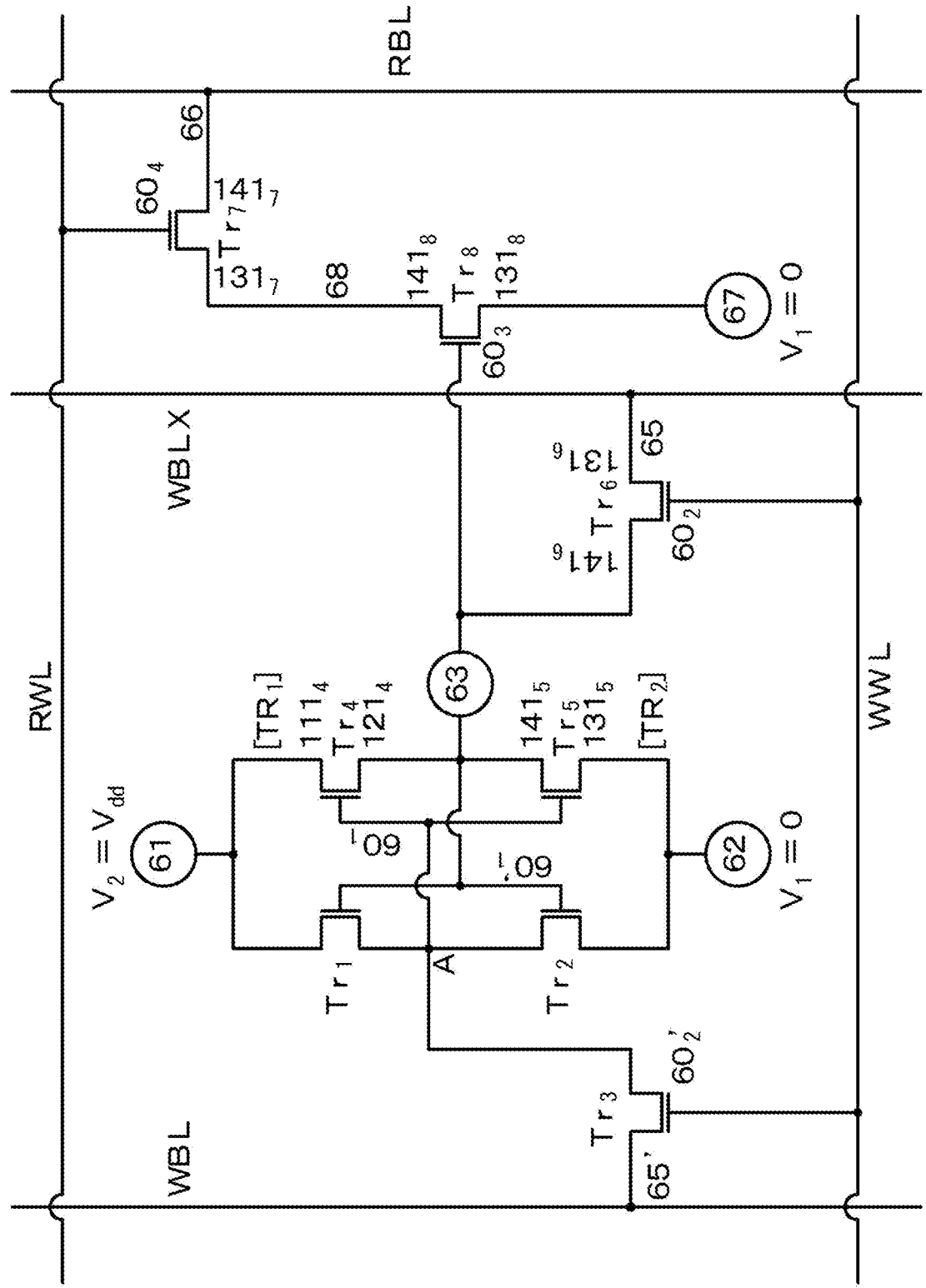
FIG. 19 is a diagram depicting an equivalent circuit of an SRAM circuit including eight transistors formed on the basis of the composite transistors according to Example 1, Example 2, and Example 3.
Figure 20A:
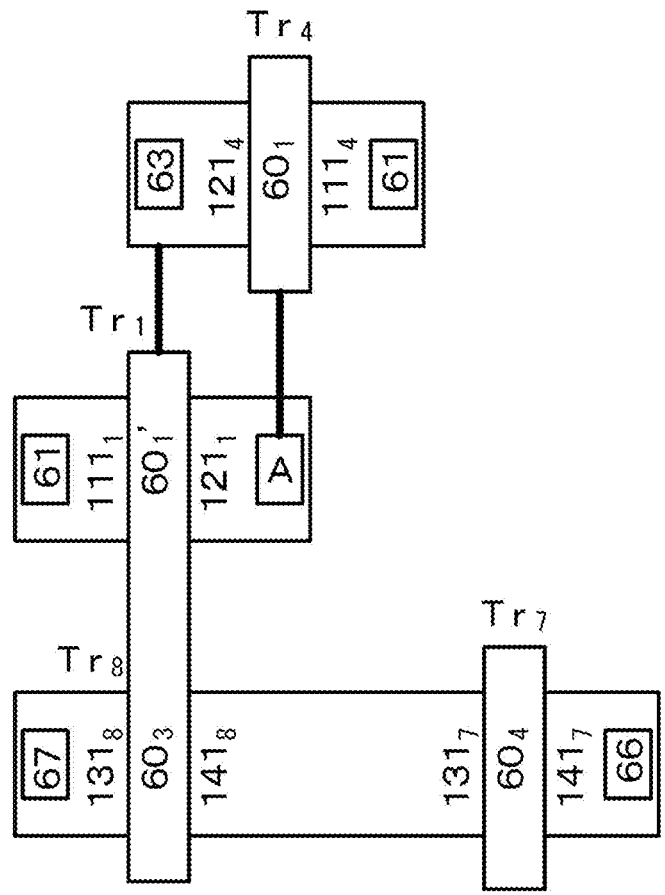
FIGS. 20A and 20B are schematic diagrams depicting an arrangement of constituents of the SRAM circuit including the composite transistor according to Example 1.
Figure 20B:
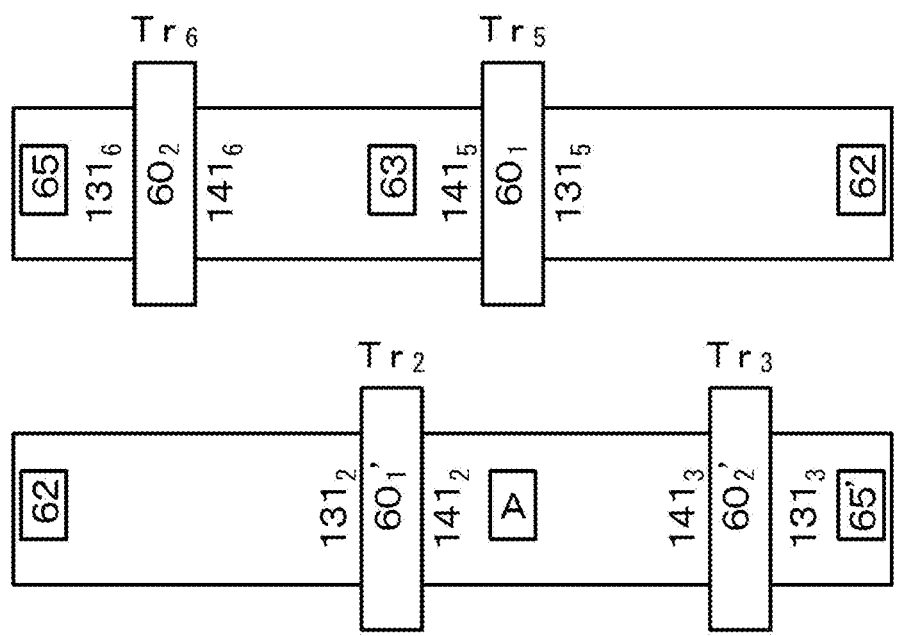
Figure 21A:
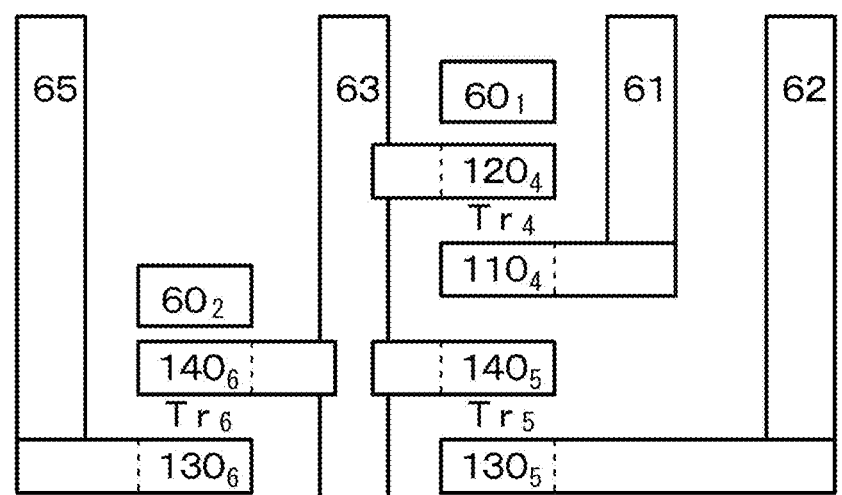
FIGS. 21A and 21B are conceptual partly cutaway sectional views depicting the SRAM circuit formed on the basis of the composite transistor according to Example 1.
Figure 21B:
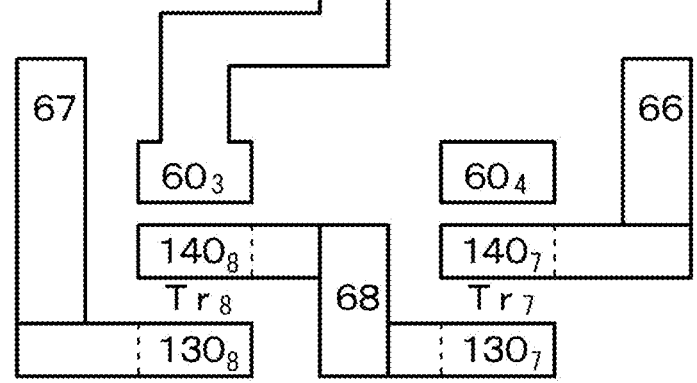
Figure 22A:
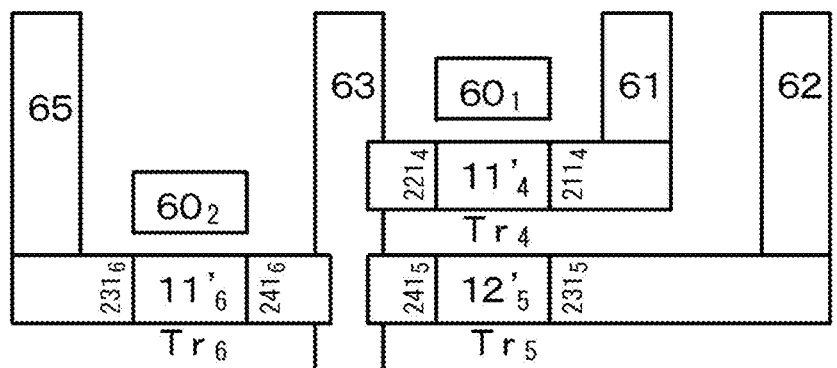
FIGS. 22A and 22B are conceptual partly cutaway sectional views depicting the SRAM circuit formed on the basis of the composite transistor according to Example 2.
Figure 22B:
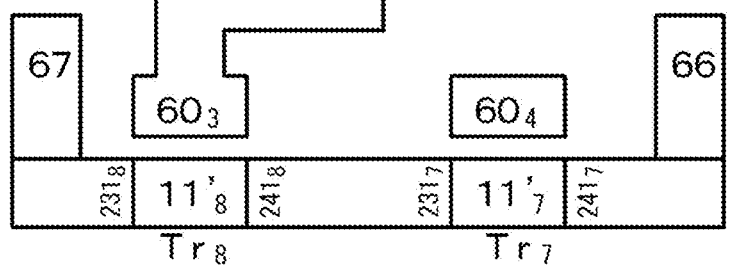
Figure 22C:
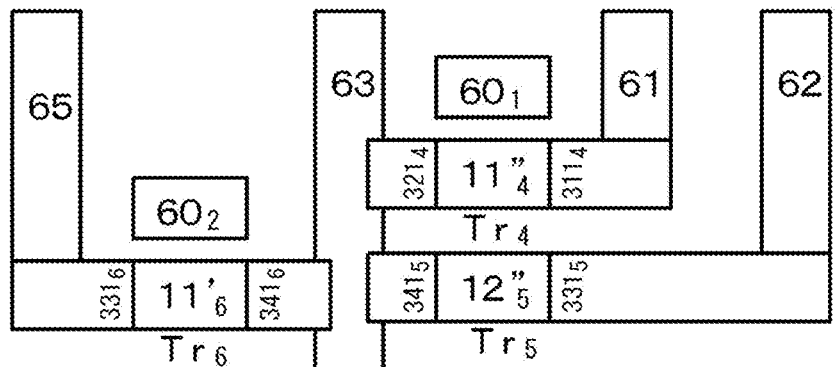
FIGS. 22C and 22D are conceptual partly cutaway sectional views depicting the SRAM circuit formed on the basis of the composite transistor according to Example 3.
Figure 22D:
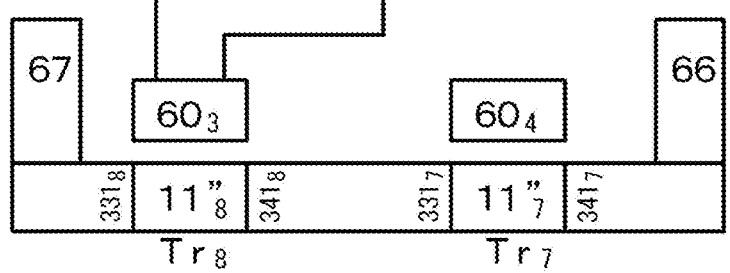

FIG. 19 is an equivalent circuit diagram of the SRAM circuit including eight transistors formed on the basis of the composite transistors according to Example 1, Example 2, and Example 3. FIGS. 20A and 20B are schematic diagrams depicting the arrangement of the constituents of the SRAM circuit which is formed on the basis of the composite transistor of Example 1. Incidentally, in the actual structure, the constituents of the SRAM circuit depicted in FIG. 20A (upper part) overlap with the constituents of the SRAM circuit depicted in FIG. 20B (upper part). Also, in the actual structure, the constituents of the SRAM circuit depicted in FIG. 20A (middle part) overlap with the constituents of the SRAM circuit depicted in FIG. 20B (lower part). In addition, FIGS. 21A and 21B are conceptual partly cutaway sectional views each depicting the SRAM circuit which is formed on the basis of the composite transistor according to Example 1. Moreover, FIGS. 22A and 22B are conceptual partly cutaway sectional views each depicting the SRAM circuit which is formed on the basis of the composite transistor according to Example 2. FIGS. 22C and 22D are conceptual partly cutaway sectional views each depicting the SRAM circuit which is formed on the basis of the composite transistor according to Example 3. Incidentally, the equivalent circuit diagram depicted in FIG. 19 is based on the composite transistor of Example 1.

The SRAM circuit according to Example 4 includes eight transistors $Tr_1$, $Tr_2$, $Tr_3$, $Tr_4$, $Tr_5$, $Tr_6$, $Tr_7$, and $Tr_8$. The structure of the SRAM circuit is known well, and hence its detailed description is omitted here.

Here, the transistor $Tr_3$ has its one end connected to a writing bit line WBL through a connecting part 65', and the transistor $Tr_3$ has its control electrode $60_2'$ connected to a writing word line WWL. Also, the transistor $Tr_6$ has its one end connected to a writing bit line WBLX through a connecting part 65, and the transistor $Tr_6$ has its control electrode $60_2$ connected to the writing word line WWL. Moreover, the transistor $Tr_7$ has its one end connected to a reading bit line RBL through a connecting part 66, and the transistor $Tr_7$ has its control electrode $60_4$ connected to a reading word line RWL. Also, the transistor $Tr_8$ has its control electrode $60_3$ connected to the third electrode 63, the transistor $Tr_8$ has its one end connected to the other end of the transistor $Tr_7$, and the transistor $Tr_8$ has its other end grounded through a connecting part 67.

The illustrated circuit contains the fourth transistor $Tr_4$ and the fifth transistor $Tr_5$ which constitute the composite transistor disclosed herein. In other words, the fourth transistor $Tr_4$ corresponds to the first transistor $TR_1$ and the fifth transistor $Tr_5$ corresponds to the second transistor $TR_2$. Moreover, the first transistor $Tr_1$ and the second transistor $Tr_2$ are identical in configuration and structure with the composite transistor of the present disclosure except that they lack the third electrode. In other words, the first transistor $Tr_1$ corresponds to the first transistor $TR_1$ and the second transistor $Tr_2$ corresponds to the second transistor $TR_2$. The first transistor $Tr_1$ includes a control electrode $60_1'$ and is connected to the first electrode 61 and a connecting part A. The second transistor $Tr_2$ includes the control electrode $60_1'$ and is connected to the second electrode 62 and the connecting part A. The third transistor $Tr_3$ is provided with the control electrode $60_2'$ and is connected to the connecting part 65' and the connecting part A.

The following description covers the fourth transistor $Tr_4$, the fifth transistor $Tr_5$, the sixth transistor $Tr_6$, the seventh transistor $Tr_7$, and the eighth transistor $Tr_8$. However, it does not cover the first transistor $Tr_1$, the second transistor $Tr_2$, and the third transistor $Tr_3$.

The first transistor $TR_1$ (the fourth transistor $Tr_4$) includes the control electrode $60_1$, the first active region $11_1$, $11'_1$, $11''_1$, a first A extending part $111_4$, $211_4$, $311_4$, and a first B extending part $121_4$, $221_4$, $321_4$. Also, the second transistor $TR_2$ (the fifth transistor $Tr_5$) includes the control electrode $60_1$, a second active region $12_5$, $12'_5$, $12''_5$, a first A extending part $131_5$, $231_5$, $331_5$, and a second B extending part $141_5$, $241_5$, $341_5$.

In addition, the sixth transistor $Tr_6$ substantially includes the second transistor $TR_2$. To be concrete, it includes the control electrode $60_2$, a first active region $12_6$, $12'_6$, $12''_6$, a second A extending part $131_6$, $231_6$, $331_6$, and a second B extending part $141_6$, $241_6$, $341_6$.

The seventh transistor $Tr_7$ also substantially includes the second transistor $TR_2$. To be concrete, it includes the control electrode $60_4$, a first active region $12_7$, $12'_7$, $12''_7$, a second A extending part $131_7$, $231_7$, $331_7$, and a second B extending part $141_7$, $241_7$, $341_7$.

The eighth transistor $Tr_8$ also substantially includes the second transistor $TR_2$. To be concrete, it includes the control electrode $60_4$, a first active region $12_8$, $12'_8$, $12''_8$, a second A extending part $131_8$, $231_8$, $331_8$, and a second B extending part $141_8$, $241_8$, $341_8$. The second B extending part $141_8$ as a constituent of the eighth transistor $Tr_8$ is connected to the second A extending part $131_7$ as a constituent of the seventh transistor $Tr_7$ through a connecting part 68.

Figure 23A:
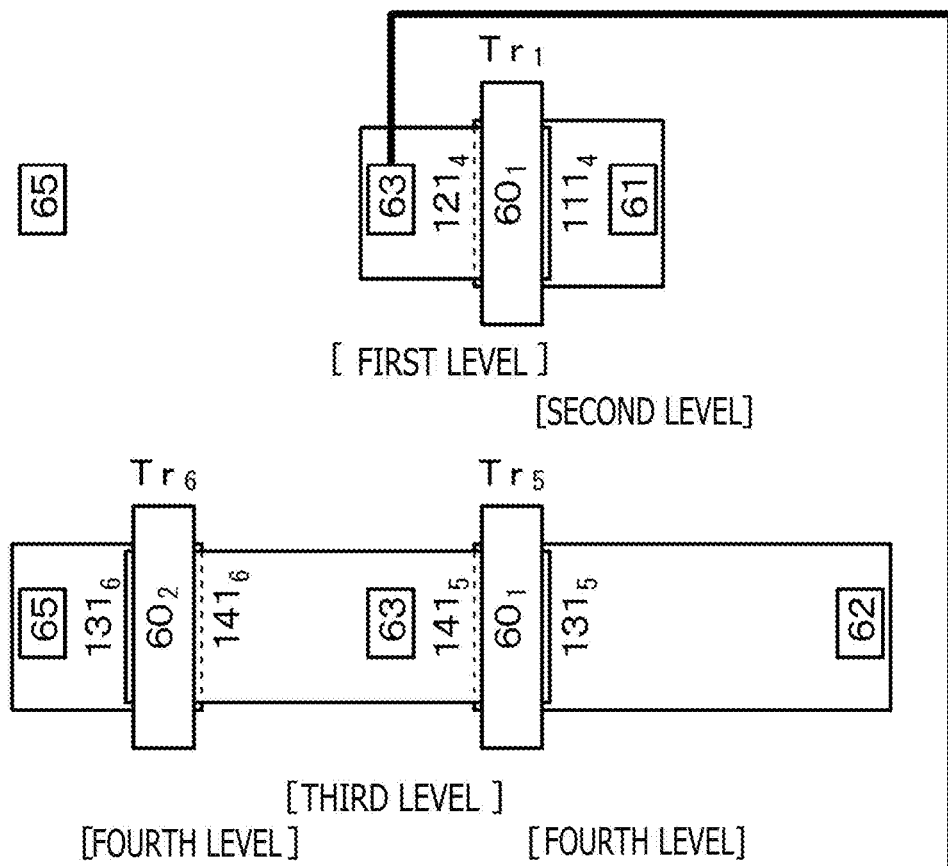
FIGS. 23A and 23B are schematic diagrams each depicting the SRAM circuit formed on the basis of the composite transistor according to Example 1, with its active regions, etc. being cut along virtual planes at four levels and one level.
Figure 23B:
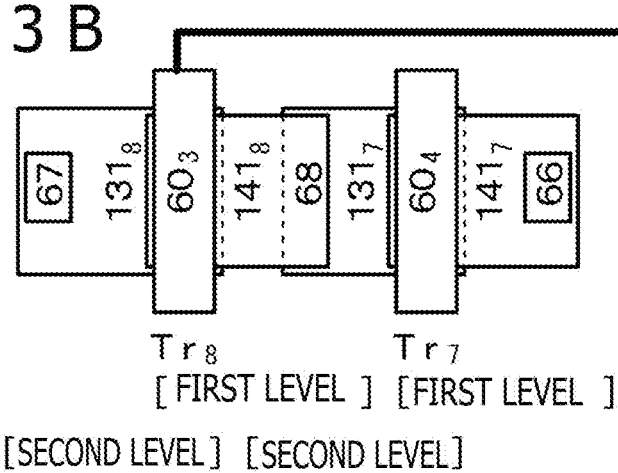
Figure 24A:
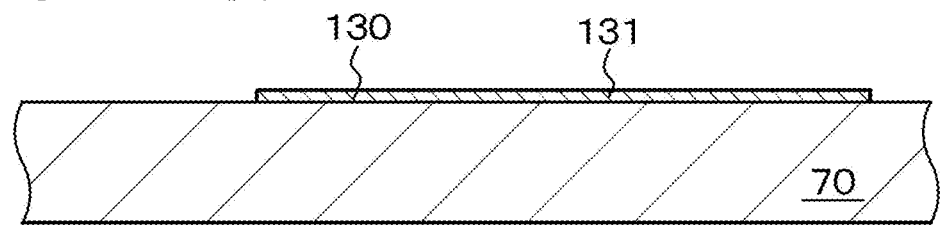
FIGS. 24A to 24D are a schematic partly cutaway sectional views of a silicon semiconductor substrate which are intended to explain a method for producing the composite transistor according to Example 1.
Figure 24B:
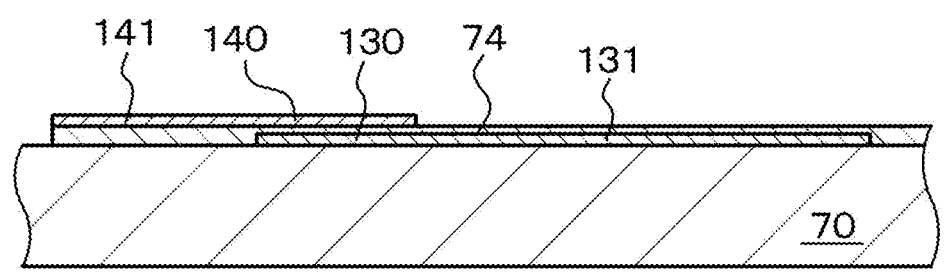
Figure 24C:
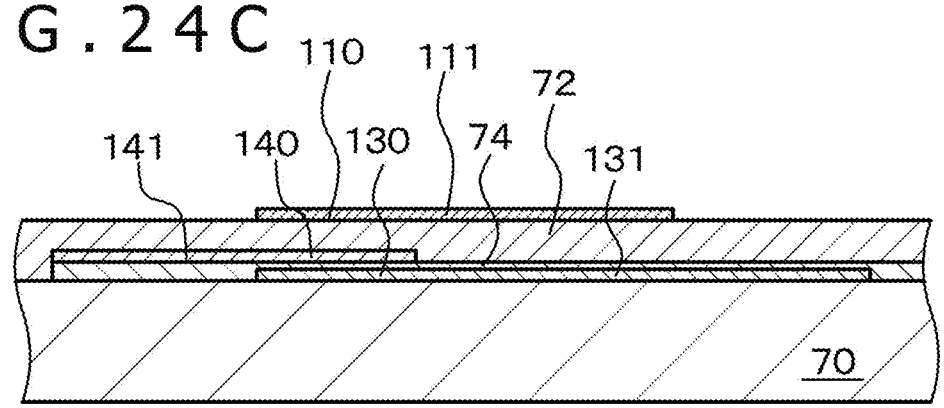
Figure 24D:
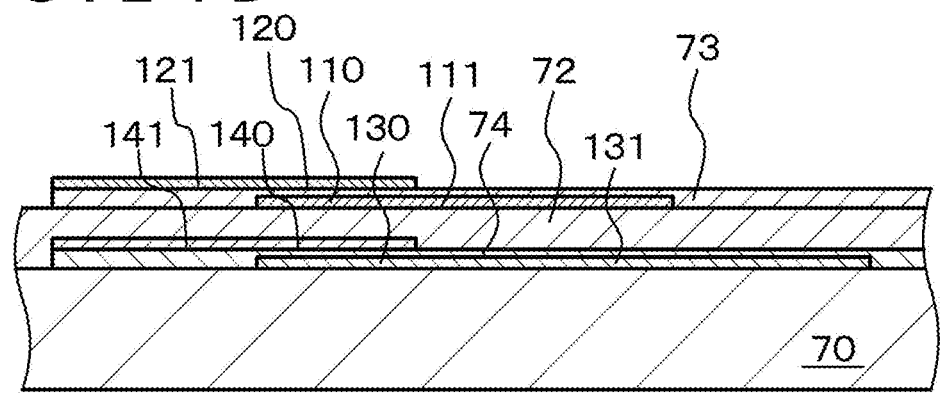

FIGS. 23A and 23B are schematic diagrams depicting the SRAM circuit formed on the basis of the composite transistor according to Example 1, with its active regions, etc. being cut along virtual planes at four levels and one level. FIG. 23A (upper part) depicts a first B active region $120_4$ and the first B extending part $121_4$, which are positioned at the first level closest to the level of the control electrode, and it also depicts a first A active region $110_4$ and the first A extending part $111_4$, which are positioned at the second level below the first level. Also, FIG. 23A (lower part) depicts a second B active region $140_5$, $140_6$ and the second B extending part $141_5$ and $141_6$, which are positioned at the third level below the second level, and it also depicts a second A active region $130_5$, $130_6$, and the second A extending part $131_5$, $131_6$, which are positioned at the forth level (lowermost level) below the third level.

In addition, FIG. 23B depicts a second B active region $140_7$, $140_8$, and the second B extending part $141_7$, $141_8$, which are positioned at the first level closest to the control electrode, and it also depicts a second A active region $130_7$, $130_8$ and the second A extending part $131_7$, $131_8$, which are positioned at the second level below the first level.

The composite transistor of the present disclosure has been described above on the basis of the preferred examples. However, the composite transistor of the present disclosure can be variously modified without being restricted to the illustrated ones in its structure, materials, and manufacturing method. In addition, various application examples of the composite transistor of the present disclosure described in the examples are merely examples and can be applied to various circuits other than mentioned above.

What is disclosed herein may be embodied in the following manner.

[A01]

<Composite Transistor>

A composite transistor including:

a first transistor including a control electrode, a first active region, a first A extending part, and a first B extending part; and a second transistor including a control electrode, a second active region, a second A extending part, and a second B extending part, in which the first active region, the second active region, and the control electrode overlap with one another in an overlapping region, each of the transistors has a first electrode, a second electrode, and a third electrode, an insulation layer is provided between the control electrode and one of the first active region and the second active region both adjacent to the control electrode, each of the two transistors has the first A extending part that extends from one end of the first active region, the first B extending part that extends from other end of the first active region, the second A extending part that extends from one end of the second active region, and the second B extending part that extends from other end of the second active region, the first electrode connects to the first A extending part, the second electrode connects to the second A extending part, and the third electrode connects to the first B extending part and the second B extending part.

[A02]

The composite transistor as defined in [A01], in which the first transistor becomes conductive and the second transistor becomes non-conductive when the first electrode is given a voltage higher than a voltage given to the second electrode and the control electrode is given a first voltage, and the second transistor becomes conductive and the first transistor becomes non-conductive when the control electrode is given a second voltage higher than the first voltage.

[A03]

The composite transistor as defined in [A01] or [A02], in which the first active region and the second active region include a two-dimensional material or graphene.

[A04]

<Composite Transistor of the First Structure>

The composite transistor as defined in any one of [A01] to [A03], in which the first active region in the overlapping region includes a first A active region and a first B active region overlapping with the first A active region, the first A extending part extends from the first A active region, the first B extending part extends from the first B active region, the second active region in the overlapping region includes a second A active region and a second B active region overlapping with the second A active region, the second A extending part extends from the second A active region, the second B extending part extends from the second B active region, an energy value $E_{V-1A}$ at an upper end of a valence band and an energy value $E_{C-1A}$ at a lower end of a conduction band of the first A active region are smaller than an energy value $E_{V-1B}$ at an upper end of a valence band and an energy value $E_{C-1B}$ at a lower end of a conduction band of the first B active region, respectively, and an energy value $E_{V-2A}$ at an upper end of a valence band and an energy value $E_{C-2A}$ at a lower end of a conduction band of the second A active region are larger than an energy value $E_{V-2B}$ at an upper end of a valence band and an energy value $E_{C-2B}$ at a lower end of a conduction band of the second B active region, respectively.

[A05]

The composite transistor as defined in [A04], in which a second insulation layer is provided between the first active region and the second active region.

[A06]

The composite transistor as defined in [A05], in which a first interlayer insulation layer is provided between the first A active region and the first B active region, and a second interlayer insulation layer is provided between the second A active region and the second B active region.

[A07]

<Composite Transistor of the Second Structure>

The composite transistor as defined in any one of [A01] to [A03], in which the first active region in the overlapping region includes a first A active region and a first B active region which is positioned on the same virtual plane as the first A active region and which faces the first A active region, the first A extending part extends from the first A active region, the first B extending part extends from the first B active region, the second active region in the overlapping region includes a second A active region and a second B active region which positions on the same virtual plane as the second A active region and which faces the second A active region, the second A extending part extends from the second A active region, the second B extending part extends from the second B active region, an energy value $E_{V-1A}$ at an upper end of a valence band and an energy value $E_{C-1A}$ at a lower end of a conduction band of the first A active region are smaller than an energy value $E_{V-1B}$ at an upper end of a valence band and an energy value $E_{C-1B}$ at a lower end of a conduction band of the first B active region, respectively, and an energy value $E_{V-2A}$ at an upper end of a valence band and an energy value $E_{C-2A}$ at a lower end of a conduction band of the second A active region are larger than an energy value $E_{V-2B}$ at an upper end of a valence band and an energy value $E_{C-2B}$ at a lower end of a conduction band of the second B active region, respectively.

[A08]

The composite transistor as defined in [A07], in which a second insulation layer is provided between the first active region and the second active region.

[A09]

<Composite Transistor of the Third Structure>

The composite transistor as defined in [A01], in which the first active region in the overlapping region includes a first channel forming region, the first A extending part extends from one end of the first channel forming region, the first B extending part extends from the other end of the first channel forming region, the second active region in the overlapping region includes a second channel forming region, the second A extending part extends from one end of the second channel forming region, the second B extending part extends from other end of the second channel forming region, the first transistor becomes conductive and the second transistor becomes non-conductive when the control electrode is given a first voltage, and the second transistor becomes conductive and the first transistor becomes non-conductive when the control electrode is given a second voltage which is higher than the first voltage.

[A10]

The composite transistor as defined in [A09], in which a second insulation layer is provided between the first active region and the second active region.

[A11]

The composite transistor as defined in [A09] or [A10], in which the first active region and the second active region include a two-dimensional material or graphene.

REFERENCE SIGNS LIST 11, 11', 11" . . . First active region
12, 12', 12" . . . Second active region
60, 60' . . . Control electrode
61 . . . First electrode
62 . . . Second electrode
63 . . . Third electrode
64, 65, 65', 66, 67, 68 . . . Connecting part
70 . . . Silicon semiconductor substrate
71 . . . Insulation layer
72 . . . Second insulation layer
73 . . . First interlayer insulation layer (first boundary region)

74 . . . Second interlayer insulation layer (second boundary region)
75 . . . Upper interlayer insulation layer
110, 210 . . . First A active region
120, 220 . . . First B active region
130, 230 . . . Second A active region
140, 240 . . . Second B active region
310 . . . First channel forming region
330 . . . Second channel forming region
111, 211, 311 . . . First A extending part
121, 221, 321 . . . First B extending part
131, 231, 331 . . . Second A extending part
141, 241, 341 . . . Second B extending part
212 . . . First boundary region
232 . . . Second boundary region
$TR_1$ . . . First transistor
$TR_2$ . . . Second transistor

The invention claimed is:

1. A composite transistor, comprising:
a first transistor including a control electrode, a first active region, a first A extending part, and a first B extending part; and
a second transistor including the control electrode, a second active region, a second A extending part, and a second B extending part, wherein the first active region, the second active region, and the control electrode overlap with one another in an overlapping region,
each of the two transistors has a first electrode, a second electrode, and a third electrode,
an insulation layer is provided between the control electrode and one of the first active region and the second active region both adjacent to the control electrode,
each of the two transistors has the first A extending part that extends from one end of the first active region, the first B extending part that extends from another end of the first active region, the second A extending part that extends from one end of the second active region, and the second B extending part that extends from another end of the second active region,
the first electrode connects to the first A extending part,
the second electrode connects to the second A extending part,
the third electrode connects to the first B extending part and the second B extending part,
the first active region in the overlapping region includes a first A active region and a first B active region overlapping with the first A active region,
the first A extending part extends from the first A active region,
the first B extending part extends from the first B active region,
the second active region in the overlapping region includes a second A active region and a second B active region overlapping with the second A active region,
the second A extending part extends from the second A active region, and
the second B extending part extends from the second B active region.

2. The composite transistor according to claim 1, wherein the first transistor becomes conductive and the second transistor becomes non-conductive when the first electrode is given a voltage higher than a voltage given to the second electrode and the control electrode is given a first voltage, and the second transistor becomes conductive and the first transistor becomes non-conductive when the control electrode is given a second voltage higher than the first voltage.

3. The composite transistor according to claim 1, wherein the first active region and the second active region include a two-dimensional material or graphene.

4. The composite transistor of claim 1, wherein a second insulation layer is provided between the first active region and the second active region.

5. The composite transistor according to claim 4, wherein the first active region and the second active region include a two-dimensional material or graphene.

6. The composite transistor according to claim 5,
wherein a first interlayer insulation layer is provided between the first A active region and the first B active region, and
a second interlayer insulation layer is provided between the second A active region and the second B active region.

7. The composite transistor according to claim 4,
wherein a first interlayer insulation layer is provided between the first A active region and the first B active region, and
a second interlayer insulation layer is provided between the second A active region and the second B active region.

8. A composite transistor, comprising:
a first transistor including a control electrode, a first active region, a first A extending part, and a first B extending part; and
a second transistor including the control electrode, a second active region, a second A extending part, and a second B extending part, wherein the first active region, the second active region, and the control electrode overlap with one another in an overlapping region,
each of the two transistors has a first electrode, a second electrode, and a third electrode,
an insulation layer is provided between the control electrode and one of the first active region and the second active region both adjacent to the control electrode,
each of the two transistors has the first A extending part that extends from one end of the first active region, the first B extending part that extends from another end of the first active region, the second A extending part that extends from one end of the second active region, and the second B extending part that extends from another end of the second active region,
the first electrode connects to the first A extending part,
the second electrode connects to the second A extending part,
the third electrode connects to the first B extending part and the second B extending part,
the first active region in the overlapping region includes a first A active region and a first B active region which is positioned on the same virtual plane as the first A active region and which faces the first A active region,
the first A extending part extends from the first A active region,
the first B extending part extends from the first B active region,
the second active region in the overlapping region includes a second A active region and a second B active region which is positioned on the same virtual plane as the second A active region and which faces the second A active region,
the second A extending part extends from the second A active region, and
the second B extending part extends from the second B active region.

9. The composite transistor according to claim 8, wherein the first transistor becomes conductive and the second transistor becomes non-conductive when the first electrode is given a voltage higher than a voltage given to the second electrode and the control electrode is given a first voltage, and the second transistor becomes conductive and the first transistor becomes non-conductive when the control electrode is given a second voltage higher than the first voltage.

10. The composite transistor of claim 8, wherein the first active region and the second active region include a two-dimensional material or graphene.

11. The composite transistor according to claim 8, wherein a second insulation layer is provided between the first active region and the second active region.

12. The composite transistor of claim 11, wherein the first active region and the second active region include a two-dimensional material or graphene.

13. The composite transistor according to claim 12,
wherein a first interlayer insulation layer is provided
between the first A active region and the first B active region, and
a second interlayer insulation layer is provided between the second A active region and the second B active region.

14. The composite transistor according to claim 11,
wherein a first interlayer insulation layer is provided
between the first A active region and the first B active region, and
a second interlayer insulation layer is provided between the second A active region and the second B active region.

* * * * *